United States Patent
Koike et al.

[11] Patent Number: 5,945,689
[45] Date of Patent: Aug. 31, 1999

[54] LIGHT-EMITTING SEMICONDUCTOR DEVICE USING GROUP III NITRIDE COMPOUND

[75] Inventors: Masayoshi Koike; Shinya Asami, both of Aichi-ken, Japan

[73] Assignee: Toyoda Gosei Co., Ltd., Aichi-ken, Japan

[21] Appl. No.: 08/616,884

[22] Filed: Mar. 18, 1996

[30] Foreign Application Priority Data

| Mar. 17, 1995 | [JP] | Japan | 7-086083 |
| Mar. 17, 1995 | [JP] | Japan | 7-086084 |
| Jul. 24, 1995 | [JP] | Japan | 7-209182 |
| Jul. 24, 1995 | [JP] | Japan | 7-209183 |

[51] Int. Cl.$^6$ .................................... H01L 33/00
[52] U.S. Cl. ........................ 257/88; 257/96; 257/103
[58] Field of Search ..................... 257/88, 94, 95, 257/96, 103

[56] References Cited

U.S. PATENT DOCUMENTS

| 5,578,839 | 11/1996 | Nakamura et al. |       |
| 5,650,641 | 7/1997  | Sassa et al.    | 257/88 |
| 5,652,438 | 7/1997  | Sassa et al.    | 257/94 |

FOREIGN PATENT DOCUMENTS

| 0 559 224 | 6/1994 | European Pat. Off. |
| 0 716 457 | 6/1996 | European Pat. Off. |
| 6-260680  | 9/1994 | Japan. |
| 6-268257  | 9/1994 | Japan. |
| WO 96 03776 | 2/1996 | WIPO. |

OTHER PUBLICATIONS

Nakamura et al, "Gallium Nitride Compound Semiconductor Light Emitting Element", JP 6268257, Patent Abstracts of Japan, Sep. 22, 1994.

*Primary Examiner*—Peter Toby Brown
*Assistant Examiner*—Roy Potter
*Attorney, Agent, or Firm*—Pillsbury Madison & Sutro LLP

[57] ABSTRACT

An emission layer (5) for a light source device is formed to have a multi-layer structure, doped with an acceptor and a donor impurity. The multi-layer structure may include a quantum well (QW) structure or a multi quantum well (MQW) structure (50). With such a structure, a peak wavelength of the light source can be controlled, because the distances between atoms of the acceptor and the donor impurities are widened. Several arrangements can be made by, e.g., altering the thickness of each composite layer of the multi-layer structure, altering their composition ratio, forming undoped layer 5 between the impurity doped layers, and so forth. Further, luminous intensity of ultra violet color can be improved, because doping the donor impurity and the acceptor impurity realizes a donor-acceptor emission mechanism and abundant carriers. Several arrangements can be made by, e.g., optimizing the materials of the composite layers, optimizing their composition ratios, optimizing their lattice constants, and so forth to further enhance the luminous intensity of the light source.

39 Claims, 14 Drawing Sheets

5,945,689

LIGHT-EMITTING SEMICONDUCTOR DEVICE USING GROUP III NITRIDE COMPOUND

BACKGROUND OF THE INVENTION

1. Field of the Invention

The present invention relates to a light-emitting semiconductor diode (LED) and a laser diode (LD) that use a Group III nitride compound and that has a multiple emission layer. Especially, the invention relates to an LED and an LD having an improved emission efficiency in the visible short wavelength region from the green blue to blue color and in the ultra violet region.

2. Description of the Related Art

It has been known that an aluminum gallium indium nitride (AlGaInN) compound semiconductor may be used to obtain a light-emitting diode (LED) or a laser diode (LD) which emits blue and ultra violet color light. This semiconductor device is useful because of its high luminous efficiency resulting from direct electron transition and because of its ability to emit blue light, which is one of the three primary colors.

By irradiating an electron beam and carrying out heat treatment, a magnesium (Mg) doped i-layer is changed into a p-type conductive layer. As a result, an LED or an LD is obtained having a double hetero p–n junction structure made of an aluminum gallium nitride (AlGaN) p-layer, a zinc (Zn) doped indium gallium nitride (InGaN) emission layer, and an AlGaN n-layer. Such an LED or LD is more prosperous in the semiconductor market than a conventional LED having a metal insulator semiconductor (MIS) structure which includes an n-layer and a semi-insulating i-layer.

As shown in FIG. 6, an LED 10 is disclosed in Japanese Patent Application No. 113484/1994 (not yet laid open) which has higher luminous emission. A GaInN emission layer 5 of the LED 10 is doped with both zinc (Zn) and silicon (Si), and both planes of the emission layer 5 form a double hetero-junction structure with an adjacent AlGaN n-layer 4 and an AlGaN p-layer 61. The peak wavelength of the LED 10 is between 420 and 450 nm and its luminous intensity is 1000 mcd. Such LEDs with higher luminous intensity of blue color are in great demand, for example, for use in multicolor display devices.

While light, having a peak wavelength of about 500 nm, resulting in a green blue or dark green color, is required for traffic signal lights, the conventional LED 10 is unable to provide that required wavelength. In order to meet that requirement, the energy band width of the emission layer needs to be narrowed by increasing the ratio of indium (In) among the components of the emission layer 5. Furthermore, both an acceptor impurity and a donor impurity are doped into the emission layer 5 controlling their impurity concentrations to maximize luminous intensity of the LED.

Such arrangements, increasing the In ratio among the composites of the emission layer 5 and doping the emission layer with an acceptor and a donor impurity, however, rather raise significant potential energy caused by the Coulomb force between the acceptor and the donor, and the electron transition energy becomes equal to the sum of the potential energy and the energy difference between the acceptor and donor levels. The energy difference between the acceptor and donor levels virtually becomes larger than that in the case of no Coulomb force. As a result, the peak wavelength is shifted toward a shorter wavelength in the luminous spectrum and the required wavelength peak of 500 nm cannot be obtained.

As shown in FIG. 10, a gallium nitride compound semiconductor device 20 with a multiple emission layer structure is disclosed in laid-open Japanese Patent Application number 268257/1994. The emission layer is formed by three $In_{0.2}Ga_{0.8}N$ 44 wells and two $In_{0.04}Ga_{0.96}N$ 44' barriers. Each of them has a thickness ranging from 5 to 50 Å and they are laminated alternately.

The peak wavelength of the device 20 of FIG. 10 is still around 410 to 420 nm, because the emission mechanism of the device 20 is an inter-band recombination formed without doping any impurities in the wells 44 which act as a luminous center. Such a peak wavelength does not meet the required 500 nm wavelength for a traffic signal. Further, the luminous intensity of the device 20 still has room for improvement. Therefore, there is a need for an LED having both a larger peak wavelength and higher luminous intensity.

InGaN and AlGaN are representative materials for an emission layer of a Group III nitride compound semiconductor device which emits ultraviolet rays. When InGaN is utilized for the emission layer and the composition ratio of In is 5.5% or less an ultraviolet ray having a peak wavelength of 380 nm is obtained and the emission mechanism of the device is the inter-band recombination. When AlGaN is utilized for the emission layer, the emission layer is doped with Zn and Si, and the composition ratio of Al is around 16%, an ultraviolet ray having a peak wavelength of 380 nm is obtained and the emission mechanism of the device is the electron transition between energy levels of the donor and the acceptor.

Although the peak wavelength of such devices utilizing InGaN or AlGaN is satisfactory, the luminous efficiency of the same is still poor for several reasons. The emission layer made of InGaN has a poor luminous efficiency due to poor crystallinity as a result of low growth temperature and carrier recombination between bands. The emission layer made of AlGaN has a poor luminous efficiency due to a dislocation resulting in a mismatch of lattice constants.

SUMMARY OF THE INVENTION

A first object of the present invention is, therefore, to improve the luminous efficiency for blue color produced by an LED utilizing a group III nitrogen compound and to shift (lengthen) the peak wavelength of such an LED toward around 500 nm.

A second object of the present invention is to improve the luminous efficiency of ultra violet light produced by an LED or an LD utilizing a group III nitrogen compound.

In accordance with first aspect of the invention, a multiple emission layer is provided. Acceptor and donor impurities are alternately doped into each composite layer of the multiple emission layer so as to widen distance between the atoms of the acceptor impurity and the donor impurity.

In accordance with a second aspect of the invention, an undoped layer is provided between a donor doped layer and an acceptor doped layer so as to widen distance between the atoms of the acceptor and the donor impurity.

Conventionally, both a donor impurity and an acceptor impurity are doped into a single emission layer to obtain a higher luminous intensity. However, with an LED having such a structure, it is difficult to control the peak wavelength, and it is especially difficult to increase the length of the peak wavelength. The inventors of the present invention have performed research and have discovered that a close distance between the atoms of an acceptor impurity and the atoms of a donor impurity generates a Coulomb force which influences a transitional electron and substantially widens the energy level difference between the impurities. As a result, a longer peak wavelength cannot be obtained.

The emission peak energy hv is calculated by:

$$hv = Eg - (ED + EA) + (q^2/r)$$

when h is the Plank's constant, v is the frequency of light, Eg is the energy band gap, ED is the activation energy of the donor, EA is the activation energy of the acceptor, r is the distance between atoms of the donor impurity and the acceptor impurity, q is the elementary electric charge, and is the dielectric constant.

As the expression shows, a longer peak wavelength is attained by a larger value r, or by a longer distance between the atoms of the acceptor impurity and the donor impurity. The inventors of the present invention propose several structural arrangements to obtain a larger value r. Namely, an emission layer is formed as a multi-layer structure, and its composite layers are alternately doped with an acceptor impurity and a donor impurity. Further, the thickness and/or composition ratio of the impurity-doped composite layers can be varied to obtain a desired peak wavelength. As further alternate, an undoped layer can be formed between impurity doped layers, and further modulation doping such as δ doping can be used to dope impurities slightly into the composite layers.

With these arrangements, the distance r is widened. Since the Coulomb force corresponds to the distance from the center of a layer to that of another on average, the influence of the Coulomb force generated by the atoms of the acceptor and the donor impurity may be mitigated substantially by widening the distance r.

Consequently, the peak wavelength can be shifted toward longer value as intended, i.e., from 450 nm to 500 nm. In addition, other conditions of the emission layer, such as composite materials, their composition rate, doped impurities, their concentration and so forth, can be adopted and optimized to obtain maximum luminous intensity, so that high luminous intensity of blue color around 3000 mcd can be maintained.

In accordance with a third aspect of the invention, an emission layer is provided which has a quantum well (QW) structure with at least one set of a well and a barrier is doped with both an acceptor impurity and a donor impurity.

The QW structure contributes to an increase in output power and luminous intensity, because the well of the QW structure is surrounded by barriers each having a band gap wider than that of the well, and because carriers that emerge from the barriers are poured into the well and contribute to luminous emission. Consequently, luminous intensity is improved. Further, doping both an acceptor impurity and a donor impurity into the well lengthen the peak wavelength, because of the transition between energy levels of the acceptor impurity and the donor impurity, and improves the luminous intensity, because of abundant existence of carriers. Further, the acceptor impurity and the donor impurity may be doped into both the well and the barrier to obtain higher luminous intensity.

In accordance with a fourth aspect of the invention, an emission layer is provided which has a QW structure at least constituted by a set of an $Al_{x2}Ga_{1-x2}N$ barrier and an $Al_{x1}Ga_{1-x1}N$ well, where x1<x2.

The molar composition rate of Al is designed to be 15% or more in order to obtain shorter peak wavelength around 380 nm. The thickness of the well is designed to range from 50 Å to 200 Å. It is preferred that the thickness of the well not be thinner than 50 Å, because impurities are spread or diffused into an adjacent layer. It is preferred that the thickness of the well not be more than 200 Å, because a quantum effect cannot be expected. The thickness of the barriers is designed to range from 50 Å to 200 Å. It is preferred that the thickness of the barriers not be less than 50 Å, because the efficiency of carrier containment in the well drops. It is preferred that the thickness of the barriers not be more than 200 Å, because a quantum effect cannot be expected. Further, barriers thicker than 200 Å are not preferred, because the barrier has a large resistivity when it is undoped, and may have cracks because of dislocations when it is doped with impurities.

The preferable impurity concentration of the acceptor impurity and the donor impurity doped into the QW emission layer is in the range from $1\times10^{17}/cm^3$ to $1\times10^{20}/cm^3$ respectively. It is preferred that the concentration of each impurity not be lower than $1\times10^{17}/cm^3$, because luminous efficiency drops due to lack of luminous centers. It is preferred that their concentration of each impurity not be higher than $1\times10^{20}/cm^3$, because crystallinity becomes poor and an Auger effect emerges.

The luminous efficiency is improved by utilizing AlGaN for the emission layer which has a better crystallinity than InGaN. And also the emission layer is constituted by a super lattice structure of QW preventing a mismatched lattice constant from spreading. Consequently, the crystallinity of the well and the luminous efficiency are improved. Further, a donor-acceptor pair emission layer formed by doping both an acceptor impurity and a donor impurity into the well or both the well and the barrier improves luminous efficiency.

In accordance with a fifth aspect of the invention, a QW emission layer is provided which comprises at least one set of a $Al_{x1}Ga_{y1}In_{1-x1-y1}N$ well and a $Al_{x2}Ga_{y2}In_{1-x2-y2}N$ barrier whose forbidden band is wider than that of the well. The well or both the well and the barrier are doped with either a donor impurity or an acceptor impurity. Accordingly, either a donor or an acceptor energy level is formed in the well or both in the well and the barrier, so that the possibility of recombination between electrons and holes due to the formation of a donor or an acceptor energy level increases. Consequently, luminous efficiency is greatly improved. Further, the composition ratio and the impurity concentration of indium (In) are optimized balancing intended peak wavelength and luminous intensity.

Other objects, features, and characteristics of the present invention will become apparent upon consideration of the following description and the appended claims with reference to the accompanying drawings, all of which form a part of the specification, wherein like reference numerals designate corresponding parts in the various figures.

DETAILED DESCRIPTION OF SEVERAL EXEMPLARY EMBODIMENT

The invention will be more fully understood by reference to the following examples.

EXAMPLE 1

Figure 1:
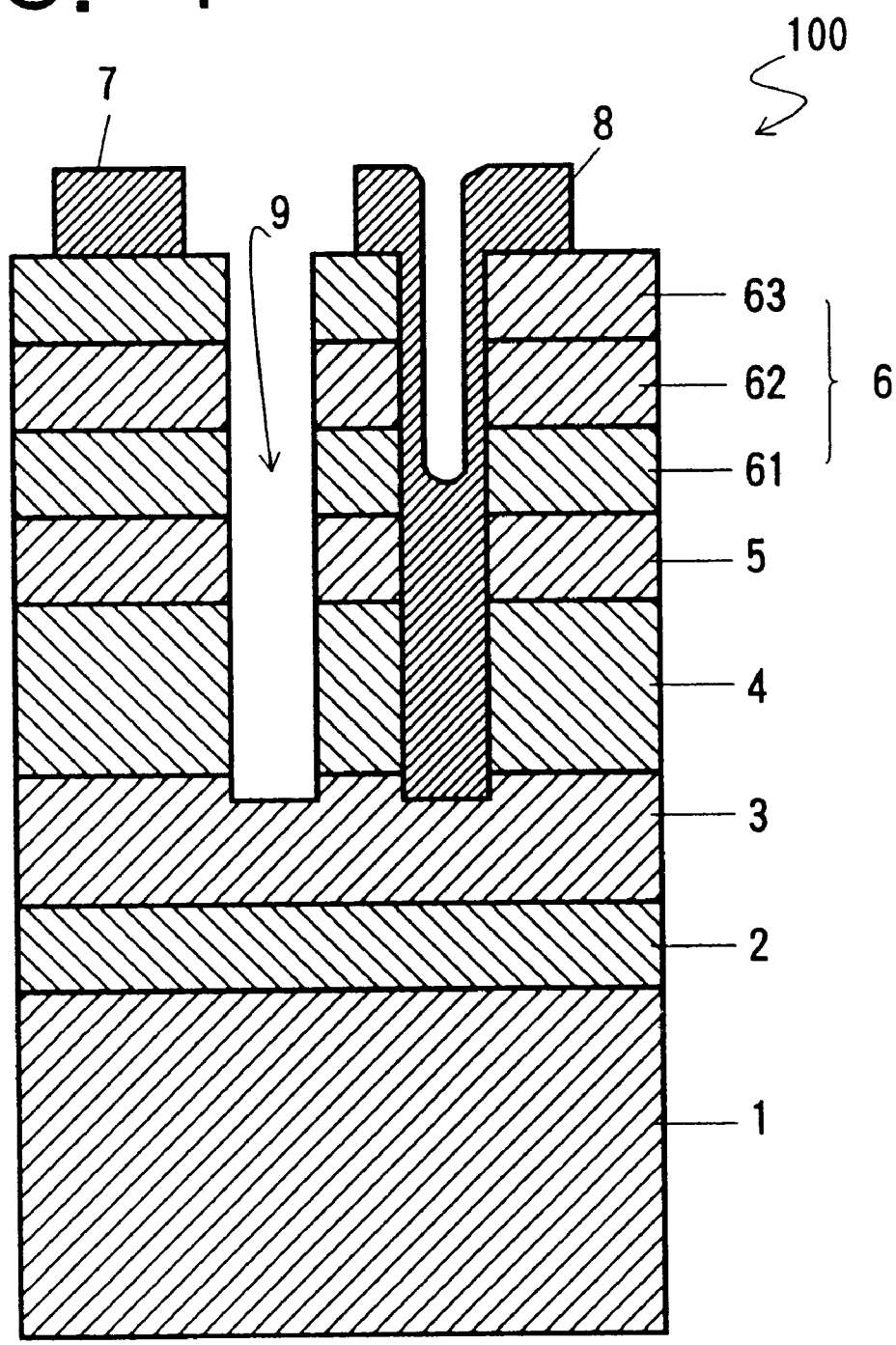
FIG. 1 is a diagram showing the structure of an LED in Example 1 (described below)
Figure 2:
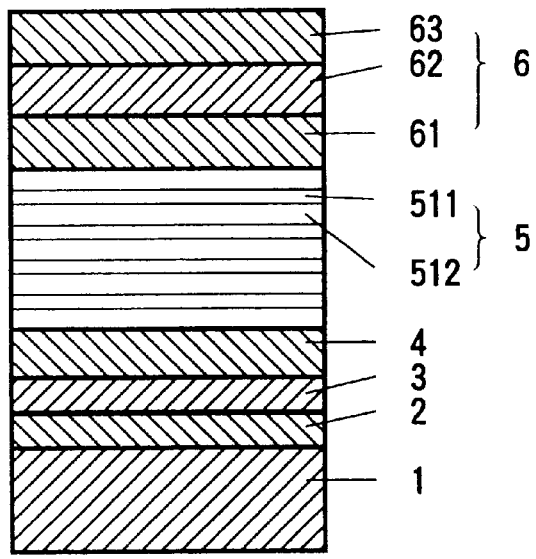
FIG. 2 is an explanatory view showing the structure of a multiple emission layer in Example 1.

FIG. 1 shows an LED 100 embodied in Example 1, and FIG. 2 shows a layered structure corresponding to the LED 100 shown in FIG. 1, depicting a multi-layered emission layer 5 in more detail. It has a sapphire ($Al_2O_3$) substrate 1 upon which a 500 Å in thickness of aluminum nitride (AlN) buffer layer 2 is formed. Consecutively, two n-type layers are formed on the AlN buffer layer 2: about 2.0 $\mu$m in thickness of silicon (Si) doped GaN forms an $n^+$-layer 3 of high carrier concentration having an electron concentration of $2\times10^{18}/cm^3$; and about 2.0 $\mu$m in thickness of Si-doped $Al_{x2}Ga_{1-x2}N$ forms an n-type clad layer 4 having an electron concentration of $8\times10^{17}/cm^3$.

On the n-type clad layer 4, an emission layer 5 about 0.52 $\mu$m in thickness and having a multi-layer structure, is formed as shown in FIG. 2. The emission layer 5 includes 13 A-layers 511 and 13 D-layers 512 which are made of magnesium (Mg) and zinc (Zn) doped $Ga_yIn_{1-y}N$ where $0<y<1$ and 13 Mg- and Si-doped $Ga_yIn_{1-y}N$ where $0<y<1$, respectively. Each one of these two kinds of layers are alternately and repeatedly stocked upon each other. One of the D-layers 512 is the lowermost layer which is formed on the n-type clad layer 4. Three p-layers are formed on the emission layer 5: about 1.0 $\mu$m in thickness of Mg-doped $Al_{x1}Ga_{1-x1}N$ forms a p-layer 61 which acts as a clad layer having a hole concentration of $5\times10^{17}/cm^3$ and an Mg concentration of $1\times10^{20}/cm^3$; about 0.2 $\mu$m in thickness of Mg-doped GaN forms a p-layer 62 which acts as the second contact layer having a hole concentration of $5\times10^{17}/cm^3$ and an Mg concentration of $1\times10^2/cm^3$; and about 500 Å in thickness of Mg-doped GaN forms a p-layer 63 as the first contact layer having a hole concentration of $2\times10^{17}/cm^3$ and an Mg concentration of $2\times10^{20}/cm^3$. Nickel electrodes 7 and 8 are each connected to the first contact layer 63 and nickel electrode 8 is also connected to the $n^+$-layer 3. They are electrically insulated from one another by a groove 9.

The LED 100 is produced by gaseous phase epitaxial growth, called metal organic vapor phase epitaxy, referred to as MOVPE hereinafter.

The gases employed in this process are ammonia ($NH_3$), a carrier gas ($H_2$ or $N_2$), trimethyl gallium ($Ga(CH_3)_3$) (TMG hereinafter), trimethyl aluminum ($Al(CH_3)_3$) (TMA hereinafter), trimethyl indium ($In(CH_3)_3$) (TMI hereinafter), diethylzinc (($Zn(C_2H_2)_2$)) (DEZ hereinafter), silane ($SiH_4$), and biscyclopentadienyl magnesium ($Mg(C_5H_5)_2$) ($CP_2Mg$ hereinafter).

The single crystalline sapphire substrate 1, whose main surface 'a' was cleaned by an organic washing solvent and heat treatment, was placed on a susceptor in a reaction chamber for the MOVPE treatment. Then the sapphire substrate 1 was baked at 1100° C. by a vapor of $H_2$ fed into the chamber at a flow rate of 2 liter/min. under normal pressure for a period of 30 min.

A 500 Å in thickness of AlN buffer layer 2 was formed on the surface 'a' of the etched sapphire substrate 1 under conditions controlled by lowering the temperature in the chamber to 400° C., keeping the temperature constant, and concurrently supplying for a period of 90 sec. $H_2$ at a flow rate of 20 liter/min., $NH_3$ at 10 liter/min., and TMA at $1.8\times10^{-5}$ mol/min. About 2.0 $\mu$m in thickness of Si-doped GaN, an $n^+$-layer 3 of high carrier concentration with an electron concentration of about $2\times10^{18}/cm^3$, was formed on the buffer layer 2 under conditions controlled by keeping the temperature of the sapphire substrate 1 at 1150 C. and concurrently supplying for 30 min. $H_2$ at a flow rate of 15 liter/min., $NH_3$ at 8 liter/min., TMG at $1.7\times10^{-4}$ mol/min., and silane diluted to 0.86 ppm by $H_2$ at $5\times10^{-8}$ l/min.

By using the following manufacturing process, an emission layer 5 having multi-layer structure may be formed between an n-type clad layer 4 and a p-layer 61, with emission layer 5 serving as an active layer and n-type clad layer 4 and p-layer 61 serving as clad layers; the LED 100 of this example is designed to emit light having a peak wavelength of 500 nm in the luminous spectrum and having luminous centers of Zn and Si.

About 2.0 $\mu$m in thickness of Si-doped $Al_{0.1}Ga_{0.9}N$ forms an n-type clad layer 4 with an electron concentration of $8\times10^{17}/cm^3$, was formed on $n^+$-layer 3 under conditions controlled by keeping the temperature of the sapphire substrate 1 at 1000° C. and concurrently supplying for 20 min. $N_2$ or $H_2$ at a flow rate of 10 liter/min., $NH_3$ at 10 liter/min., TMG at $1.12\times10^{-4}$ mol/min., TMA at $0.47\times10^{-4}$ mol/min., and silane diluted to 0.86 ppm by $H_2$ at $8\times10^{-9}$ mol/min.

About 200 Å in thickness of Si-doped $Ga_yIn_{1-y}N$, layer 512 (D-layer), was formed as the lowermost layer of the multiple emission layer 5 on the n-type clad layer 4 under conditions controlled by keeping the temperature of the sapphire substrate 1 at 850° C. and concurrently supplying for 4 min. $N_2$ or $H_2$ at a flow rate of 20 liter/min., $NH_3$ at 10 liter/min., TMG at $1\times10^{-5}$ mol/min., TMI $1\times10^{-4}$ mol/min., $CP_2Mg$ at $2\times10^{-4}$ mol/min., and silane diluted to 0.86 ppm by $H_2$ at $5\times10^{-9}$ mol/min. Then, replacing silane with DEZ at $2\times10^{-6}$ mol/min., about 200 Å in thickness of Zn-doped $Ga_yIn_{1-y}N$, layer 511 (A-layer), was formed on the D-layer 512 under the same conditions used to form the D-layer 512. Again, 200 Å in thickness of Si-doped $Ga_yIn_{1-y}N$ 512 was formed on the A-layer 511. In this manner, the D-layer 512 and the A-layer 511 were formed repeatedly and alternately to form a multiple emission layer 5 about 0.52 $\mu$m in thickness as shown in FIG. 2. At this stage, the multiple emission layer 5 exhibited high resistivity. The impurity concentrations of Mg, Zn, and Si doped into the multiple emission layer 5 were $1\times10^{19}/cm^3$, $5\times10^{18}/cm^3$, and $5\times10^{18}/cm^3$, respectively.

About 1.0 $\mu$m in thickness of Mg-doped $Al_{0.1}Ga_{0.9}N$ p-layer 61 was formed on the multiple emission layer 5 under conditions controlled by keeping the temperature of the sapphire substrate 1 at 1000° C. and concurrently supplying for 20 min. $N_2$ or $H_2$ at a flow rate of 10 liter/min., $NH_3$ at 10 liter/min., TMG at $1.12 \times 10^{-4}$ mol/min., TMA at $0.47 \times 10^{-4}$ mol/min., and $CP_2Mg$ at $2 \times 10^{-4}$ mol/min. The resistivity of the p-layer 61 was $10^8$ Ω·cm or more, exhibiting insulating characteristics. The impurity concentration of Mg doped into the p-layer 61 was $1 \times 10^{20}/cm^3$.

About 0.2 μm in thickness of Mg-doped GaN, second contact layer 62, was formed on the p-layer 61 under conditions of keeping the temperature of the sapphire substrate 1 at 1000° C. and concurrently supplying for 10 min. $N_2$ or $H_2$ at a flow rate of 10 liter/min., $NH_3$ at 10 liter/min., TMG at $1.12 \times 10^{-4}$ mol/min., and $CP_2Mg$ at $1 \times 10^{-4}$ mol/min. The resistivity of the p-layer 62 was $10^8$ Ω·cm or more exhibiting insulating characteristics. The impurity concentration of Mg doped into the GaN layer 62 was $1 \times 10^{20}/cm^3$.

About 500 Å in thickness of Mg-doped GaN, first contact layer 63, was formed on the GaN layer 62 under conditions of controlled by keeping the temperature of the sapphire substrate 1 at 1000° C. and concurrently supplying for 2 min. $N_2$ or $H_2$ at a flow rate of 10 liter/min., $NH_3$ at 10 liter/min., TMG at $1.12 \times 10^{-4}$ mol/min., and $CP_2Mg$ at $4 \times 10^{-4}$ mol/min. The resistivity of the first contact layer 63 was $10^8$ Ω·cm or more, exhibiting insulating characteristics. The impurity concentration of Mg doped into the GaN layer 63 was $2 \times 10^{20}/cm^3$.

Then, electron rays were uniformly irradiated into the first contact layer 63, the second contact layer 62, the p-layer 61, and the multiple emission layer 5 using a reflective electron beam diffraction device. The irradiation conditions were set at 10 KV for the accelerating voltage, 1 μA for the sample current, 0.2 mm/sec. for the speed of the scanning beam, 60 μmφ for the beam aperture, and at $5.0 \times 10^{-5}$ Torr vacuum. This irradiation changed the insulative first contact layer 63, second contact layer 62, p-layer 61, and multiple emission layer 5 into a p-type conductive semiconductor with a hole concentration of $7 \times 10^{17}/cm^3$, $5 \times 10^{17}/cm^3$, $3 \times 10^{17}/cm^3$, and $2 \times 10^{17}/cm^3$ and a resistivity of 0.5 Ω·cm, 0.8 Ω·cm, 1.5 Ω·cm, and 2 Ω·cm, respectively. As a result, a wafer with a multi-layer structure was obtained as shown in FIG. 2.

This wafer, which has a large number of elements, may be treated by conventional processes and divided or diced into individual devices in actual practice and in accordance with industry custom.

The obtained LED 100 was found to have a luminous intensity of 2000 mcd and a peak wavelength of 480 nm in the luminous spectrum at a driving current of 20 mA and a driving voltage of 4 V. The luminous intensity of the LED 100 was two times as strong as that of the conventional LED, and the peak wavelength was closer to 500 nm which is required for traffic signal lights.

EXAMPLE 2

Figure 3A:
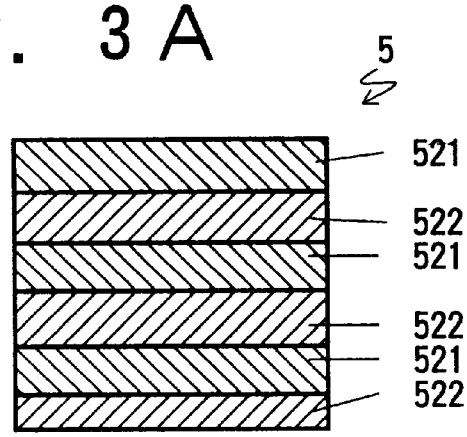
FIGS. 3A and 3B are diagrams showing the structure of a multiple emission layer in Example 2.
Figure 3B:
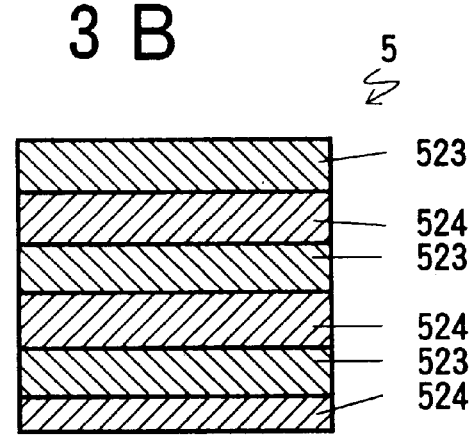

FIGS. 3A and 3B each show the structure of an emission layer 5 having a multi-layer structure in accordance with Example 2. The emission layer 5 of FIG. 3A has 25 A-layers 521 of Mg- and Zn-doped InGaN and 25 D-layers 522 of Mg- and Si-doped GaN, and that of FIG. 3B has 34 A-layers 523 of Mg- and Zn-doped InGaN and 34 D-layers 524 of Mg- and Si-doped GaN. The differences between the emission layers 5 of Example 2 and Example 1 reside in the thickness of its composite layers and the materials used to form those layers.

The layers ranging from the sapphire substrate 1 to the n-type clad layer 4 were prepared by above-described processes. As shown in FIG. 3A, about 100 Å in thickness of Mg- and Si-doped GaN, layer 522 (D-layer), was formed as the lowermost layer of the multiple emission layer 5 on the n-type clad layer 4 under conditions controlled by keeping the temperature of the sapphire substrate 1 at 850° C. and concurrently supplying for 2 min. $N_2$ at a flow rate of 20 liter/min., $NH_3$ at 10 liter/min., TMG at $1 \times 10^{-5}$ mol/min., $CP_2Mg$ at $2 \times 10^{-4}$ mol/min., and silane diluted to 0.86 ppm by $H_2$ at $5 \times 10^{-9}$ mol/min. Replacing the silane with DEZ at $2 \times 10^{-6}$ mol/min., additionally supplying TMI at $1 \times 10^{-4}$ mol/min., about 100 Å in thickness of Mg- and Zn-doped $In_{0.15}Ga_{0.85}N$, layer 521 (A-layer), was formed on the GaN layer 522 (D-layer) under generally the same conditions used to form the GaN layer 522. In this way, the GaN layer 522 and the InGaN layer 521 were laminated repeatedly and alternately to form a whole multiple emission layer 5 about 0.5 μm in thickness. The number of the D-layers and the A-layers was 25 each and, namely the emission layer has 50 composite layers in total. The impurity concentrations of Mg, Zn, and Si doped into the emission layer 5 were $1 \times 10^{19}/cm^3$, $1 \times 10^{19}/cm^3$, and $8 \times 10^{18}/cm^3$, respectively.

FIG. 3B shows another variation of the multiple emission layer 5. The composite materials of the emission layer 5 of FIG. 3B were the same as those of FIG. 3A. The differences resided in where the impurities including Mg, Zn and Si, were doped and the thickness of each composite layer. Zn and Mg were doped into the GaN layer 524 (A-layer) whose thickness is 50 Å, and Si and Mg were doped into the $In_{0.15}Ga_{0.85}N$ layer 523 (D-layer) whose thickness is 100 Å. The number of the D-layers 523 and the A-layers 524 was 34 each and, the emission layer 5 has a thickness of 0.51 μm and 68 composite layers in total. The impurity concentrations of Mg, Zn, and Si doped into the emission layer 5 were $1 \times 10^{19}/cm^3$, $5 \times 10^{18}/cm^3$, and $5 \times 10^{18}/cm^3$, respectively.

Processes used to form other layers such as the clad layer 61, were the same as those described above for the LED 100 in Example 1.

The obtained LEDs with the respective multiple emission layer structures of FIGS. 3A and 3B were found to be satisfactory in luminous intensity and peak wavelength, the former having a luminous intensity of 3000 mcd and a peak wavelength of 500 nm and the latter having a luminous intensity of 2500 mcd and a peak wavelength of 490 nm, each at a driving current of 20 mA and a driving voltage of 4V.

EXAMPLE 3

Figure 4A:
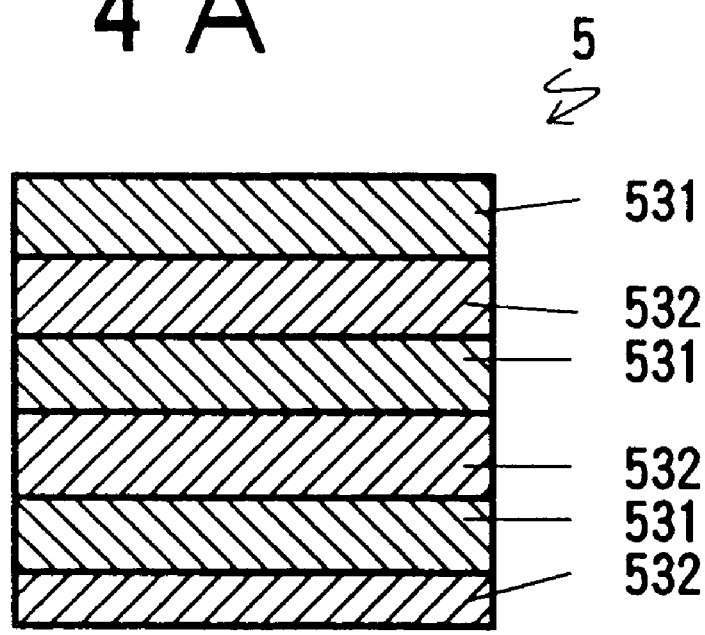
FIGS. 4A and 4B are diagrams showing the structure of a multiple emission layer in Example 3.
Figure 4B:
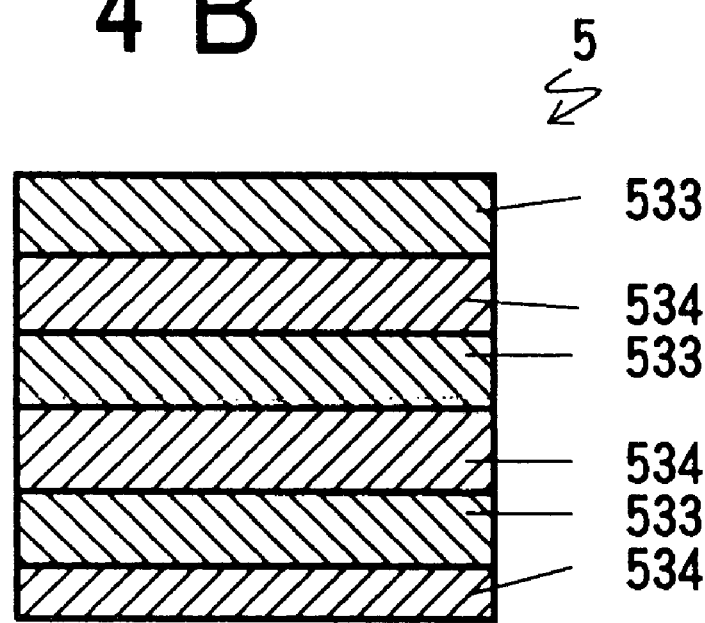

FIGS. 4A and 4B each show the structure of an multiple emission layer 5 in accordance with Example 3. The emission layer 5 of FIG. 4A has 25 A-layers of Zn-doped $In_{0.08}Ga_{0.92}N$ layers 531 having a Zn concentration of $5 \times 10^{18}/cm^3$ and 25 D-layers 532 of Si-doped $Al_{0.1}Ga_{0.9}N$ having an Si concentration of $5 \times 10^{18}/cm^3$, and that of FIG. 4B has 25 D-layers 533 of Si-doped $In_{0.08}Ga_{0.92}N$ having an Si concentration of $2 \times 10^{18}/cm^3$ and 25 A-layers 534 of Zn-doped $Al_{0.1}Ga_{0.9}N$ having a Zn concentration of $1 \times 10^{18}/cm^3$. The A-layers and D-layers were laminated alternately and repeatedly, each having a 100 Å thickness. The D-layer 532 and the A-layer 534 are the lowermost layers. The entire emission layer 5 is about 0.5 μm in thickness and the total number of its composite layers is 50. The other parts of the device were manufactured as described in Example 1.

The obtained LEDs with the multiple emission layer 5 of respective FIG. 4A and FIG. 4B were each found to have a luminous intensity of from 2500 to 3000 mcd and a peak wavelength peak of 490 nm, at a driving current of 20 mA and a driving voltage of 4V.

In Examples 1 to 3, the preferable thickness of each of the composite layers 511, 512, 521, 522, 523, 524, 531, 532, 533, and 534 of emission layer 5 is from 50 Å to 500 Å. It is preferred that the composite layers not be thinner than 50 Å, because the Coulomb force could not be substantially mitigated. It is further preferred that the composite layers not be thicker than 500 Å, because with such a thickness a donor-acceptor pair emission hardly occurs.

EXAMPLE 4

Figure 5A:
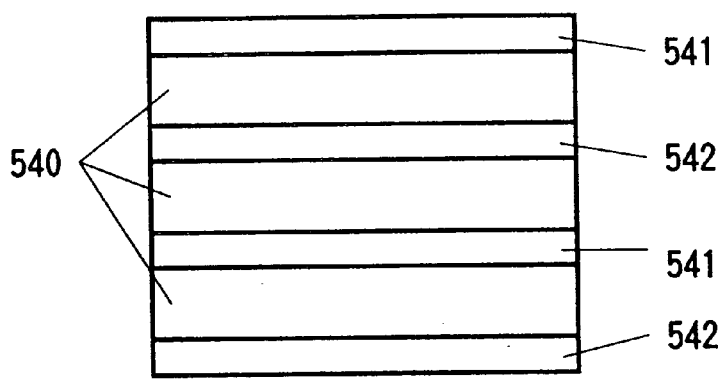
FIGS. 5A to 5C are diagrams showing the structure of a multiple emission layer in Example 4.
Figure 5B:
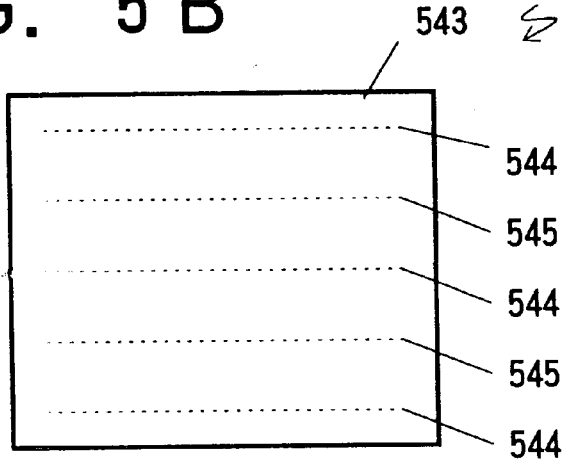
Figure 5C:
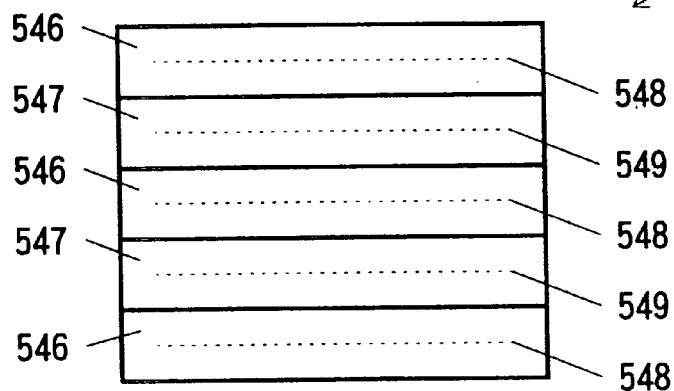
Figure 6:
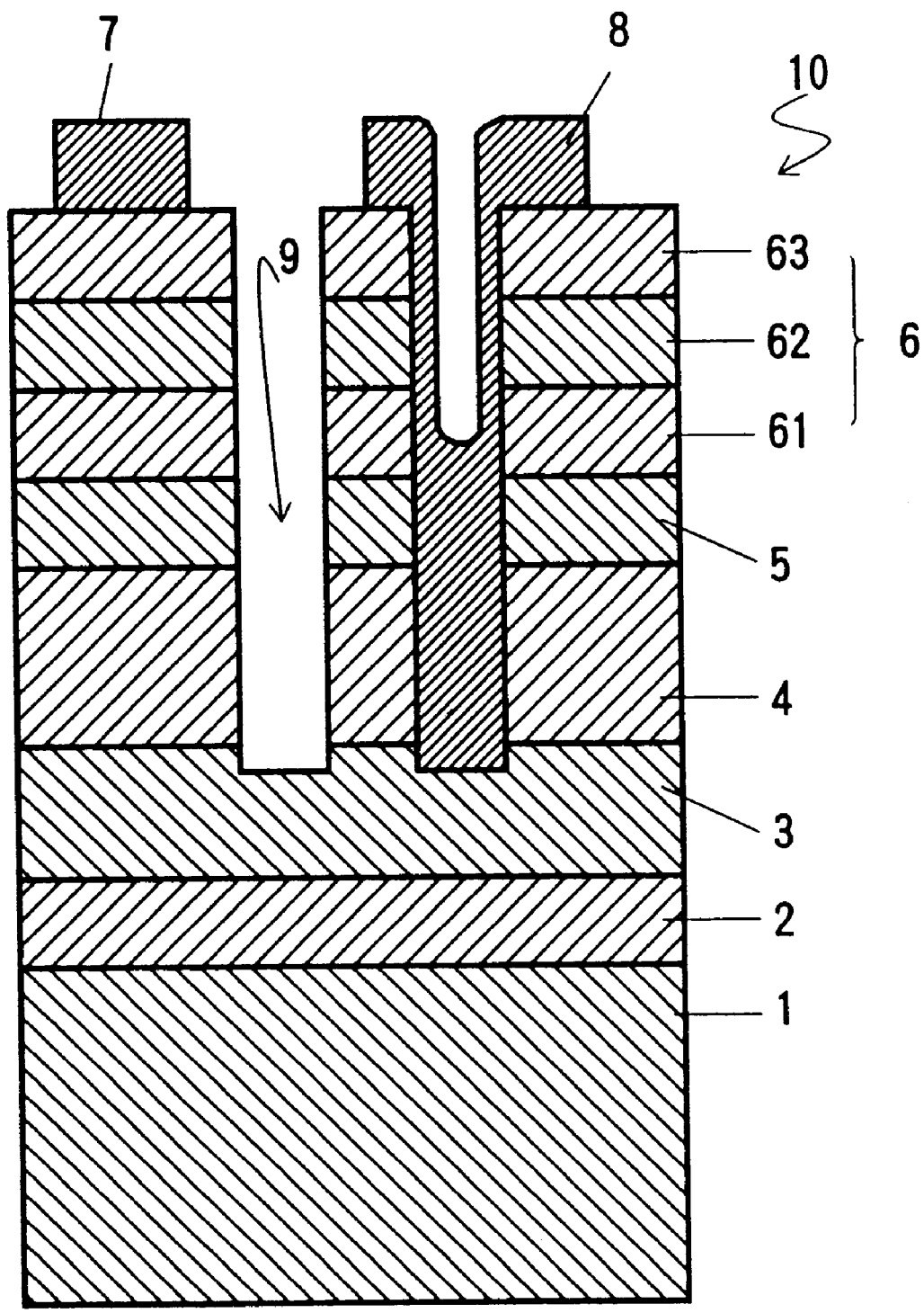
FIG. 6 is a diagram showing the structure of an LED.

FIGS. 5A to 5C show structural variations of the multiple emission layer 5. As shown in FIG. 5A, about 50 Å in thickness of an undoped layer 540 can be formed between a donor doped D-layer 541 and an acceptor doped A-layer 542. As shown in FIG. 5B, a thin donor doped D-layer 544 and a thin acceptor doped A-layer 545 were formed alternately and repeatedly in an undoped layer 543 which has a constant composition ratio. As shown in FIG. 5C, a thin donor doped D-layer 548 and a thin acceptor doped A-layer 549 can be formed in an undoped layer 546 and another undoped layer 547 which has a different composition ratio from that of the undoped layer 546, respectively, utilizing modulation doping such as δ doping.

Alternatively, the composite layers 540, 543, 546, and 547 can be Mg-doped p-type semiconductor layers. The preferable thickness of each undoped layer 540, or the distance between the D-layer 544 and the A-layer 545, is from 50 Å to 500 Å. It is preferred that each of the undoped layers 540 not be thinner than 50 Å, because the Coulomb force could not be substantially mitigated. It is preferred that each of the undoped layers 540 not be thicker than 500 Å, because with such a thickness a donor-acceptor pair emission hardly occurs.

In Examples 1 to 4, LED 100 has a double-hetero junction structure including a multiple emission layer 5 sandwiched between two adjacent layers, the p-layer 61 and the n-type clad layer 4, whose band gaps are wider than that of the multiple emission layer 5. Further, the lattice constants of the multiple emission layer 5 do not correspond with those of the p-layer 61 and the n-type clad layer 4 since the former is mainly made of InGaN compound and the latter is AlGaN. It may be more preferable to form those three layers with $Al_xIn_yGa_{1-x-y}N$ and to design their lattice constants to be equal to the lattice constant of the n$^+$-layer 3 of high carrier concentration.

In Examples 1 to 4, the preferable concentration: each of Zn and Si doped into the composite layers of the multiple emission layer 5 was found to range from $1 \times 10^{17}/cm^3$ to $1 \times 10^{20}/cm^3$ for improving luminous intensity, respectively. A more preferable concentration of each of Zn and Si is within the ranges from $1 \times 10^{18}/cm^3$ to $1 \times 10^{19}/cm^3$. When the impurity concentration is lower than $1 \times 10^{18}/cm^3$, doping impurities have little effect on luminous intensity. When the impurity concentration is higher than $1 \times 10^{19}/cm^3$, the crystallinity of the emission layer is degraded.

In Examples 1 to 4, the contact layer had a double layer structure comprising a first contact layer 63, heavily doped with Mg and the second contact layer 62, doped with a lower Mg concentration relative to that of the first contact layer 63. Alternatively, only one Mg-doped contact layer, more heavily doped than the multiple emission layer 5, can be formed beneath the electrodes 7 and 8. The desirable Mg concentration for contact layer is in the range of from $1 \times 10^{19}/cm^3$ to $1 \times 10^{21}/cm^3$, to optimize conductivity. Alternatively, Mg may not be doped into the emission layer 5. Namely, the conduction type of the emission layer may be arbitrary.

Although GaN was utilized as the material of the contact layers 62 and 63, mixed materials or crystals of $In_xGa_{1-x}N$ of the p-type can be utilized alternatively.

In Examples 1 to 4, Mg and Zn were employed as an acceptor impurity and Si was employed as a donor impurity. Alternatively, beryllium (Be), magnesium (Mg), cadmium (Cd), and mercury (Hg) of the group II elements can be used as an acceptor impurity and one or more of carbon (C), germanium (Ge), tin (Sn), lead (Pb) of the Group IV elements can be used as a donor impurity. Alternatively, one or more of the noted Group IV elements can be used as an acceptor impurity and one or more of sulfur (S), selenium (Se), and tellurium (Te) of the Group VI elements can be used as a donor impurity.

Heat annealing, heat treatment in an atmosphere of $N_2$ gases, or laser irradiation can be used as an alternative to the electron irradiation to obtain p-type conduction.

Further, the emission layer 5, the n-layer 4, and p-layers 61, 62, and 63 can be made of $Al_xGa_yIn_{1-x-y}N$ with arbitrary composition ratio.

EXAMPLE 5

Figure 7:
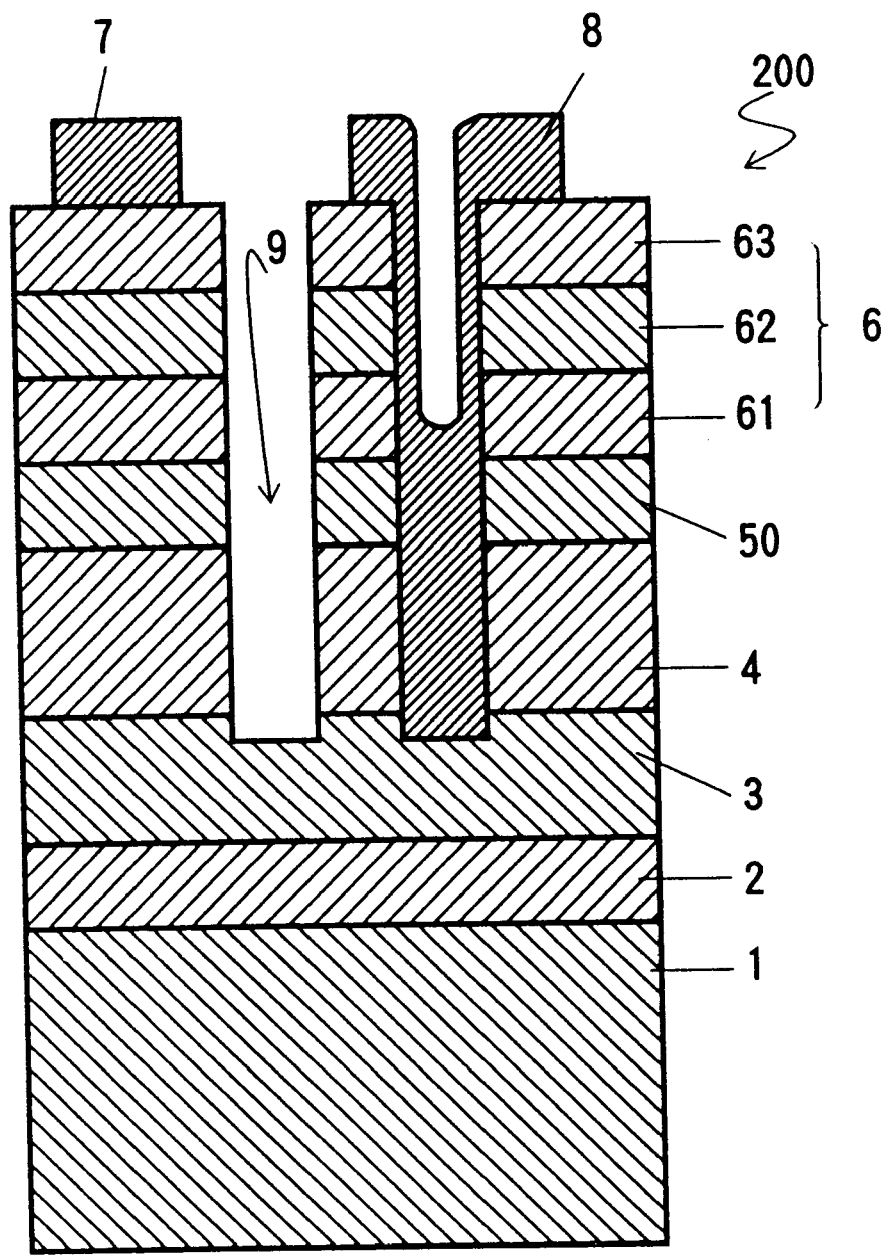
FIG. 7 is a diagram showing the structure of an LED in Example 5.
Figure 8:
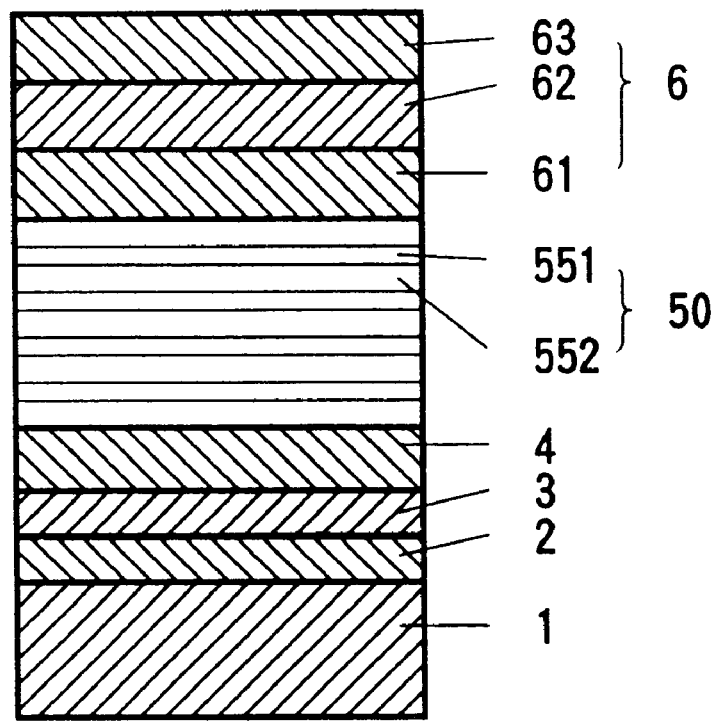
FIG. 8 is an explanatory view showing the structure of a multiple emission layer in Example 5.

FIG. 7 shows a LED 200 with a multi quantum well (MQW) emission, or active, layer 50 and FIG. 8 shows the details of that layer. The MQW emission layer 50, constituted by consecutively and alternately formed 25 wells 522 of Zn- and Si-doped $Al_{x3}In_{y3}Ga_{1-x3-y3}N$ and 26 barriers 551 of Mg-doped $Al_{x2}In_{y2}Ga_{1-x2-y2}N$, is sandwiched between two clad layers: an Si-doped $Al_{x4}In_{y4}Ga_{1-x4-y4}N$ n-type clad layer 4 and an $Al_{x1}In_{y1}Ga_{1-x1-y1}N$ p-type layer 61. Each of the wells 552 and the barriers 551 is 100 Å in thickness.

Processes as described above were utilized to form the layers ranging from the sapphire substrate 1 to the n-type clad layer 4, the triple p-layer structure 6, and so forth.

About 100 Å in thickness of Mg-doped $Al_{x2}In_{y2}Ga_{1-x2-y2}N$, barrier 551, as the lowermost layer of the MQW emission layer 50 was formed on the n-type clad layer 4 under conditions controlled by keeping the temperature of the sapphire substrate 1 at 850° C. and concurrently supplying, for 2 min., $N_2$ or $H_2$ at 20 liter/min., $NH_3$ at 10 liter/min., TMG at $1 \times 10^{-5}$ mol/min., TMI at $1 \times 10^{-4}$ mol/min., and $CP_2Mg$ at a flow rate of $2 \times 10^{-4}$ mol/min. Then, changing these conditions by replacing $Cp_2Mg$ with DEZ at $2 \times 10^{-6}$ mol/min. and silane diluted to 0.86 ppm by $H_2$ at $5 \times 10^{-9}$ mol/min., about 100 Å in thickness of Zn- and Si-doped $Al_{x3}In_{y3}Ga_{1-x3-y3}N$, well 552, was formed under generally the same conditions as the barrier 551. The barrier 551 and the well 552 were repeatedly and alternately formed to form a whole MQW emission layer 50 of about 0.51 μm in thickness as a whole. At this stage, the multiple emission layer 50 exhibited high resistivity. The impurity concentration of Mg doped into the barriers 551 was $1 \times 10^{20}/cm^3$, and that of Zn and Si doped into the wells 552 was $5 \times 10^{18}/cm^3$ and $5 \times 10^{18}/cm^3$, respectively.

Then, the remaining portions of LED 200 were formed using the processes described above, starting with a triple clad layer 6, including by a $Al_{x1}In_{y1}Ga_{1-x1-y1}N$ p-layer 61, a Mg-doped GaN layer 62 serving as the second contact layer, and a Mg-doped GaN layer 63 of high carrier concentration serving as the first contact layer. Electron irradiation was carried out under the same conditions that described in Example 1 to change the insulative first contact layer 63, second contact layer 62, p-layer 61, and MQW emission layer 50 into p-type conductive semiconductors with respective hole concentrations of $7 \times 10^{17}/cm^3$, $5 \times 10^{17}/cm^3$, $3 \times 10^{17}/cm^3$, and $2 \times 10^{17}/cm^3$ and respective resistivity values of 0.5 Ω·cm, 0.8 Ω·cm, 1.5 Ω·cm, and 2 Ω·cm. Thereby, a wafer with multi-structure layer was obtained as shown in FIG. 8. This wafer, which has a large number of elements, may be treated by conventional processes and divided or diced into individual devices.

The obtained LED 200 with its MQW emission layer 50 was found to have a luminous intensity of 5000 mcd and a peak wavelength of 490 nm. The luminous intensity was three folds that of the conventional LED and its peak wavelength was satisfactorily close to the 500 nm peak wavelength required for a traffic signal light.

The wavelength peak in the luminous spectrum of the LED 200 was shifted (lengthened), because the transition distance between energy levels of an acceptor Zn and a donor Si is shorter than that of the base material of the MQW emission layer 50. Further, the luminous intensity of the LED 200 was greatly improved, because there are many carriers from the adjacent barriers 551 which have p-type conduction due to Mg doping and pour into the wells 552, and because the luminous intensity between energy levels of the acceptor and the donor is improved.

EXAMPLE 6

Figure 9:
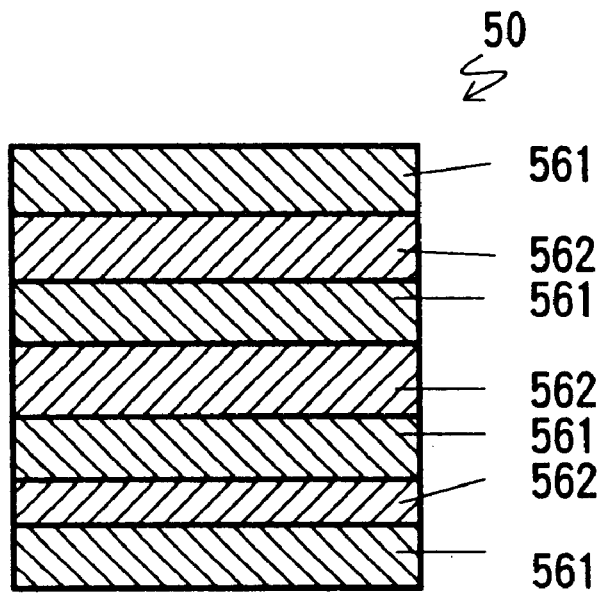
FIG. 9 is a diagram showing the structure of a multiple emission layer in Example 6.
Figure 10:
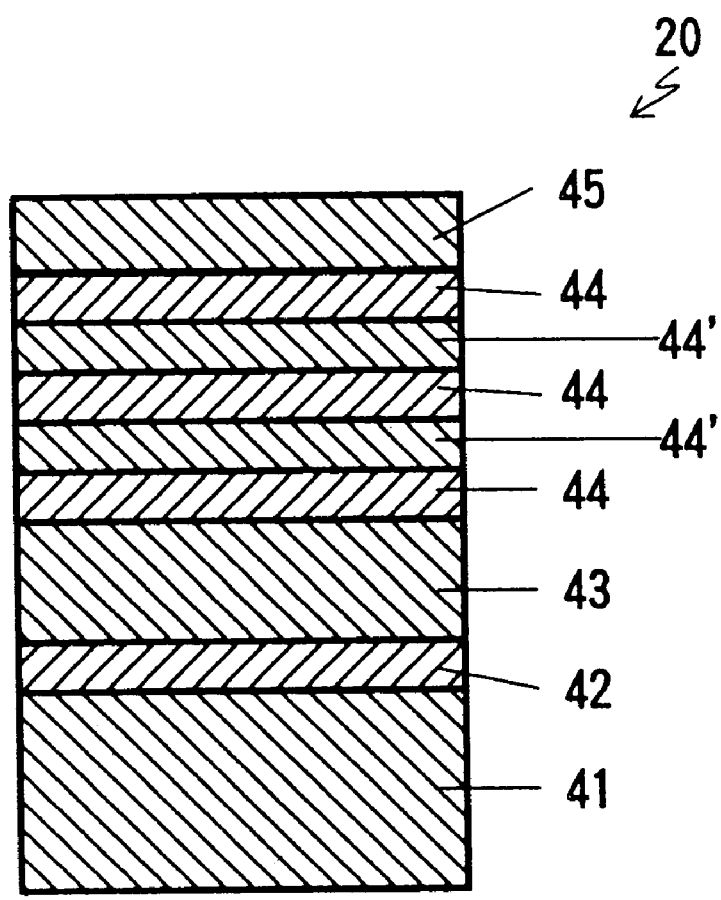
FIG. 10 is a diagram showing the structure of a conventional LED.

FIG. 9 shows a variation of the MQW emission layer 50 of Example 6. The differences between the MQW emission layers 50 in Example 6 and Example 5 reside in whether or not Mg is doped into the barriers. The same wells used in Example 5 were used in Example 6. Namely, the MQW emission layer 50 in Example 6 includes 25 wells 562 of Zn- and Si-doped $Al_{x3}In_{y3}Ga_{1-x3-y3}N$ and 26 barriers 561 of undoped $Al_{x2}In_{y2}Ga_{1-x2-y2}N$. Each one of the composite layers 562 and 561 is 100 Å in thickness and is formed repeatedly and alternately to form a whole emission layer 50 about which is 0.51 $\mu$m thick. One of the barriers 561 is the lowermost layer formed on the n-type layer 4. The impurity concentrations of Zn and Si doped into the wells 562 were $5 \times 10^{18}/cm^3$ and $5 \times 10^{18}/cm^3$, respectively.

Even though barriers 561 did not have p-type conduction, the effect was the same as that of Example 5. The LED obtained with undoped barriers 561 and Zn- and Si-doped wells 562 was found to have a luminous intensity of 4000 mcd and a peak wavelength of 490 nm at a driving current of 20 mA and a driving voltage of 4 V. The luminous intensity was more than two folds that of the conventional LED, and the peak wavelength was satisfactory for the required traffic signal peak wavelength of 500 nm in the luminous spectrum.

In Examples 5 and 6, the preferable concentrations of Zn and Si doped into the wells 552 were each found to range from $1 \times 10^{17}/cm^3$ to $1 \times 10^{20}/cm^3$ for improved luminous intensity. More specific preferable concentrations of Zn and Si were each found to range from $1 \times 10^{18}/cm^3$ to $1 \times 10^{19}/cm^3$. When the impurity concentration is lower than $1 \times 10^{18}/cm^3$, the doping impurities have little effect on luminous intensity. When the impurity concentration is higher than $1 \times 10^{19}/cm^3$, the crystallinity of the emission layer is degraded.

In Examples 5 and 6, several hetero-junction structures were formed among the clad layer 4, the barriers, the wells, and the clad layer 6. The composition ratios of Al, In, and Ga of the layers 4, 5, 6 were controlled so that the lattice constant of the layers 4, 5, and 6 is equal to the lattice constant of the n+-layer 3, the layer 4, and the layer 5, respectively.

In Examples 5 and 6, Zn was employed as an acceptor impurity and Si as a donor impurity. Alternatively, one or more of beryllium (Be), magnesium (Mg), cadmium (Cd), and mercury (Hg) of the group II elements can be used as an acceptor impurity and one or more of carbon (C), germanium (Ge), tin (Sn), and lead (Pb) of the Group IV elements can be used as a donor impurity. Alternatively, one or more of the noted Group IV elements can be used as an acceptor impurity and one or more of sulfur (S), selenium (Se), and tellurium (Te) of the Group VI elements can be used as a donor impurity.

Heat annealing, heat treatment in an atmosphere of $N_2$ gases, or laser irradiation can be used as an alternative to electron irradiation in order to obtain p-type conduction.

Further, in Examples 5 and 6, the preferable thicknesses of the barriers 551 and 561 and the wells 552 and 562 are in the range of 50 Å to 200 Å in order to generate quantum effect. Instead of Mg, any acceptor impurity can be doped into the barriers 551 and 561 as an alternative. Both acceptor and donor impurities can be doped to each of the barrier and the well. The number of the set of the barrier and the well is one or more.

EXAMPLE 7

Figure 11:
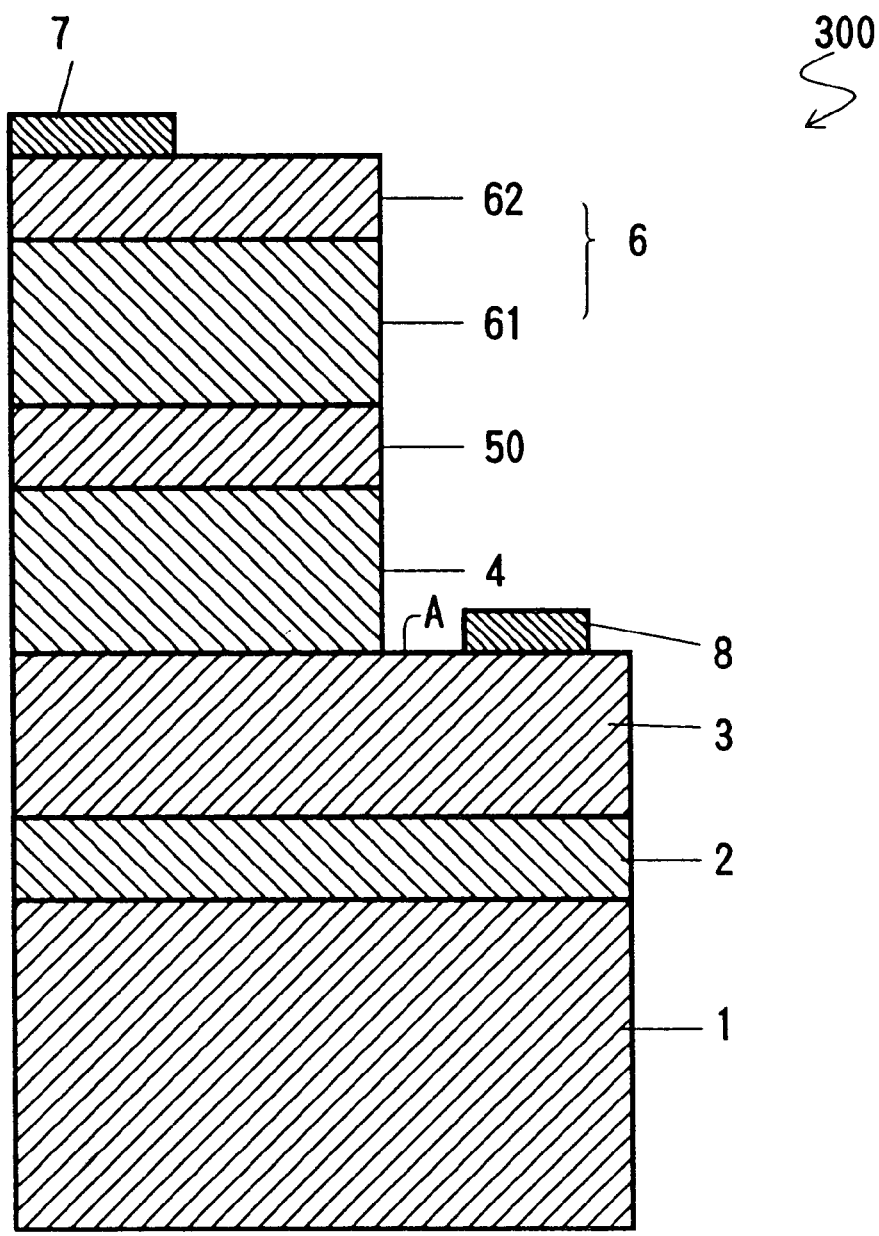
FIG. 11 is a diagram showing the structure of a LED in Example 7.

FIG. 11 shows an LED 300 embodiment formed in accordance with Example 7. It has a sapphire ($Al_2O_3$) substrate 1 upon which an aluminum nitride (AlN) buffer layer 2 of a 500 Å in thickness is formed. Consecutively, two n-type layers are formed on the AlN buffer layer 2: about 2.0 $\mu$m in thickness of silicon (Si) doped GaN forms an n+-layer 3 of high carrier concentration having an electron concentration of $2 \times 10^{18}/cm^3$; and about 1.0 $\mu$m in thickness of Si-doped $Al_{0.3}Ga_{0.7}N$ forms an n-type clad layer 4 having an electron concentration of $8 \times 17^{18}/cm^3$. On the n-type clad layer 4, about 0.11 $\mu$m in thickness of MQW, emission layer 50, is formed. On the MQW emission layer 50, about 1.0 $\mu$m in thickness of Mg-doped $Al_{0.3}Ga_{0.7}N$, p-layer 61, is formed having a hole concentration of $5 \times 10^{17}/cm^3$ and a Mg concentration of $1 \times 10^{20}/cm^3$. About 0.2 $\mu$m in thickness of Mg-doped GaN, p-layer 62, serves as a contact layer formed on the p-layer 61, and has a hole concentration of $7 \times 10^{17}/cm^3$ and a Mg concentration of $2 \times 10^{20}/cm^3$. Nickel electrodes 7 and 8 are formed and connected to the contact layer 62 and an exposed area or portion of the n+-layer 3, respectively.

Figure 12:
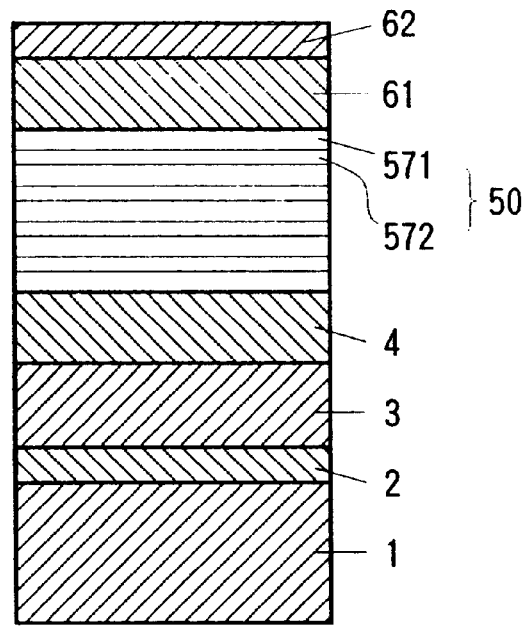
FIG. 12 through 15 are sectional views illustrating a process for manufacturing an LED as described in Example 7.

As shown in FIG. 12, the MQW emission layer 50 is constituted by five $Al_{0.2}Ga_{0.8}N$ wells 572 and six $Al_{0.25}Ga_{0.75}N$ barriers 571. The wells and the barriers are each about a 100 Å in thickness and are laminated repeatedly and alternately to form a whole MQW emission layer 50 which is about 0.11 $\mu$m thick. The concentration of each of Zn and Si doped into the wells 572 is $5 \times 10^{18}/cm^3$. The lowermost layer was one of the barriers 571 formed on the n-type clad layer 4.

The sapphire substrate 1 to the n+-layer 3 were prepared by the same processes described in Example 1. About 1.0 $\mu$m in thickness of Si-doped $Al_{0.3}Ga_{0.7}N$, n-type clad layer 4 having an electron concentration of $8 \times 10^{17}/cm^3$ was formed on the n+-layer 3 under conditions controlled by keeping the temperature of the sapphire substrate 1 at 1100° C. and by concurrently supplying for 60 min. $N_2$ or $H_2$ at a flow rate of 10 liter/min., $NH_3$ at 10 liter/min., TMG at $1.12 \times 10^{-4}$ mol/min., TMA at $0.47 \times 10^{-4}$ mol/min., and silane diluted to 0.86 ppm by $H_2$ at $10 \times 10^{-9}$ mol/min.

About 100 Å in thickness of undoped $Al_{0.25}Ga_{0.75}N$, barrier 571, was formed on the n-type clad layer 4 under conditions controlled by keeping the temperature of the sapphire substrate 1 at 1100° C. and by concurrently supplying for 3 min. $N_2$ or $H_2$ at a flow rate of 20 liter/min., $NH_3$ at 10 liter/min., TMG at $1\times10^{-5}$ mol/min., and TMA at $0.39\times10^{-4}$ mol/min. Then, about 100 Å in thickness of Zn- and Si-doped $Al_{0.2}Ga_{0.8}N$, well 572, was formed on the barrier 571 under conditions controlled by concurrently supplying for 3 min. $N_2$ or $H_2$ at a flow rate of 20 liter/min., $NH_3$ at 10 liter/min., TMG at $1\times10^{-5}$ mol/min., TMA at $0.31\times10^{-4}$ mol/min., silane diluted to 0.86 ppm by $H_2$ at $10\times10^{-9}$ mol/min. and DEZ at $2\times10^{-4}$ mol/min. The impurity concentration of Si and Zn doped into the well 572 was $5\times10^{18}/cm^3$ and $5\times10^{18}/cm^3$, respectively. The barrier 571 and the well 572 were formed repeatedly and alternately to form a whole MQW emission layer 50 which is about 0.11 μm thick.

About 1.0 μm in thickness of Mg-doped $Al_{0.3}Ga_{0.7}N$, p-layer 61, was formed on the MQW emission layer 50 under conditions controlled by keeping the temperature of the sapphire substrate 1 at 1100° C. and concurrently supplying for 60 min. $N_2$ or $H_2$ at a flow rate of 20 liter/min., $NH_3$ at 10 liter/min., TMG at $1.12\times10^{-4}$ mol/min., TMA at $0.47\times10^{-4}$ mol/min., and $CP_2Mg$ at $2\times10^{-4}$ mol/min. The resistivity of the p-layer 61 was $10^8$ Ω·cm or more exhibiting insulating characteristics. The impurity concentration of Mg doped into the p-layer 61 was $1\times10^{20}/cm^3$.

About 0.2 μm in thickness of Mg-doped GaN, contact layer 62, was formed on the p-layer 61 under conditions controlled by keeping the temperature of the sapphire substrate 1 at 1100° C. and concurrently supplying for 4 min. $N_2$ or $H_2$ at a flow rate of 20 liter/min., $NH_3$ at 10 liter/min., TMG at $1.12\times10^{-4}$ mol/min., and $CP_2Mg$ at $4\times10^{-4}$ mol/min. The resistivity of the p-layer 62 was $10^8$ Ω·cm or more, exhibiting insulating characteristics. The impurity concentration of Mg doped into the GaN layer 62 was $2\times10^{20}/cm^3$.

Then, heat treatment was carried out at the temperature of 450° C. for 45 min. which changed the insulative contact layer 62 and layer 61 into p-type conductive semiconductors with respective hole concentrations of $7\times10^{17}/cm^3$ and $5\times10^{17}/cm^3$ and respective resistivity values of 2 Ω·cm and 0.8 Ω·cm. Thereby, a wafer with multi-structure layer was obtained as shown in FIG. 12.

Figure 13:
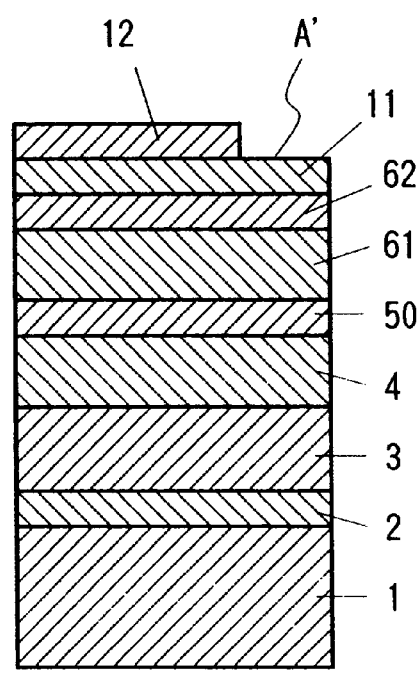
Figure 14:
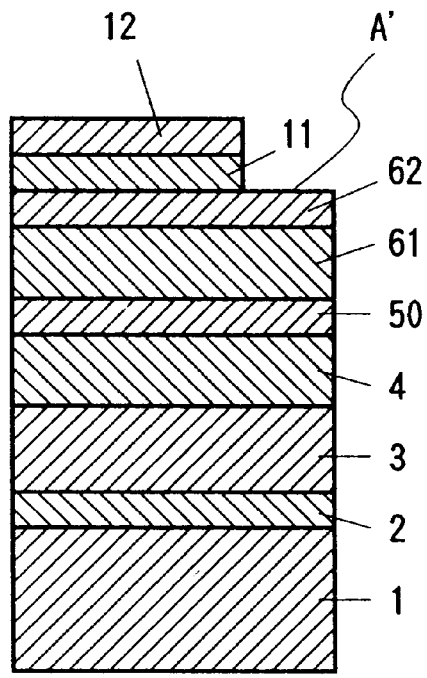
Figure 15:
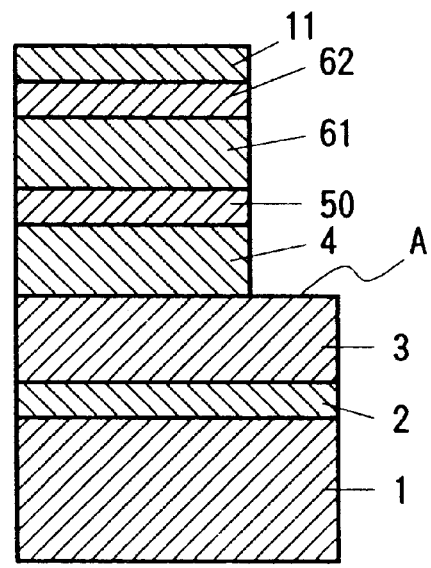

FIGS. 13 to 15 show sectional views of the formations of an individual device on the wafer. In actual practice and in accordance with industry custom, a wafer with a large number of elements thereon is treated by the following process and divided or diced into individual devices.

About 2000 Å in thickness of $SiO_2$ layer 11 was formed on the contact layer 62 by sputtering. Then, the $SiO_2$ layer 11 was coated with a photoresist layer 12. A selected part or area of the photoresist layer 12, named A', was removed by photolithography as shown in FIG. 13. Part of the area of the $SiO_2$ layer 11 which was not covered with the photoresist layer 12 was then etched off by an etching liquid such as hydrofluoric acid as shown in FIG. 14.

Then, the exposed part of the successive layers from the surface of the device, the contact layer 62 down to the $n^+$-layer 3 of high carrier concentration, were removed by dry etching, or by supplying a high-frequency power density of 0.44 W/cm$^2$ and $BCl_3$ gas of 10 ml/min. at a vacuum degree of 0.04 Torr. After that, dry etching with argon (Ar) was carried out on the device. Consequently, an electrode forming part A of the $n^+$-layer 3 of high carrier concentration was formed as shown in FIG. 15.

Then, the remaining $SiO_2$ layer 11 on the GaN p-layer 62 was removed by hydrofluoric acid, a nickel (Ni) layer was laminated on the entire surface of the device by vapor deposition, and a photoresist was deposited thereon. The photoresist was then selectively etched off by photolithography leaving patterns of configuration for the to-be-formed electrodes connected to the $n^+$-layer 3 of high carrier concentration and the p-layer 62, respectively. Using the photoresist as a mask, the exposed part or area of the Ni layer from the photoresist was etched off by an etching liquid such as nitric acid. Then, the photoresist layer was removed by a photoresist removal liquid such as acetone. Consecutively, a Ni electrode 8 was formed on the $n^+$-layer 3 of high carrier concentration and the electrode 7 was formed on the p-layer 62.

A wafer treated with the above-mentioned process was divided or diced to form separate chips or elements including a gallium nitride compound LED 300 as shown in FIG. 11.

The obtained LED 300 was found to have a luminous intensity of 2 mW and a peak wavelength of 380 nm in the luminous spectrum at a driving current of 20 mA. The luminous efficiency was 3% which is 10 folds of the conventional LED.

EXAMPLE 8

Figure 16:
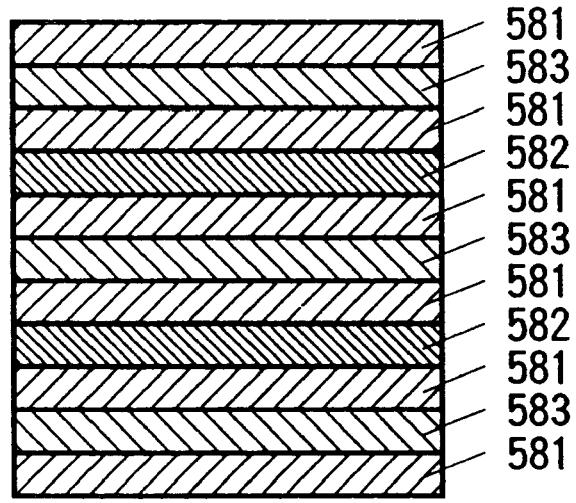
FIG. 16 is a diagram showing the structure of a multiple emission layer in Example 8.

FIG. 16 shows an MQW emission layer 50 in accordance with Example 8. The difference between Examples 7 and 8 resides in whether or not both Zn and Si are doped into each of the wells. In Example 7, both Zn and Si were doped into each of the five wells 572, but in Example 8, either Zn or Si is doped into each of the five wells, selectively. Namely, in Example 8, each one of two Zn-doped wells 582 and three Si-doped wells 583 is formed alternately between two adjacent ones of undoped six barriers 581 to form a 0.11 μm thick MQW emission layer. One of the six barriers 581 is the lowermost layer formed on the n-type clad layer 4. Other conditions and other layers are the same as those used to form the LED 300 in Example 7.

The structure of the MQW emission layer 50 in this embodiment realized light emission between acceptor and donor energy levels, and improved ultra violet luminous efficiency.

The obtained LED with the MQW structure of this embodiment was found to have a luminous intensity of 5 mW and a peak wavelength of 380 nm in the luminous spectrum at a driving current of 20 mA. The luminous efficiency was 7% which is 25 folds of the conventional LED.

EXAMPLE 9

Figure 17:
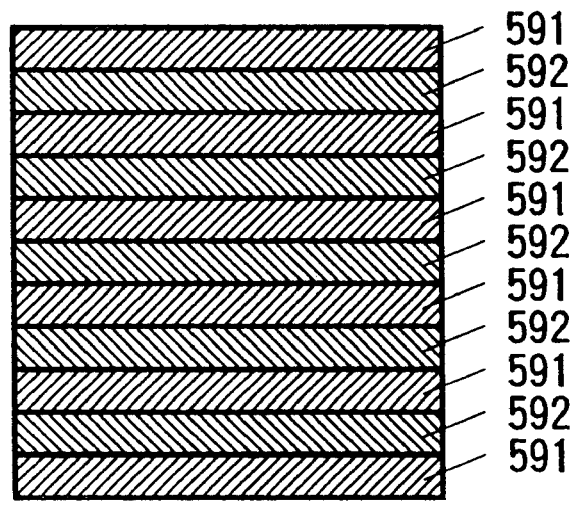
FIG. 17 is a diagram showing the structure of a multiple emission layer in Example 9.

As shown in FIG. 17, the MQW emission layer 50 in this embodiment has six Si-doped barriers 591 and five Zn-doped wells 592 which was formed alternately. One of the six barrier layer was the lowermost layer which was formed on the n-type clad layer 4. The thickness of the well and the barrier and other conditions are the same as those of the LED 300 in Example 7.

This structure also realized light emission between acceptor and donor energy levels and improved ultra violet luminous efficiency. In the alternative, Si can be dope into the wells 592 and Zn can be doped into the barriers 591.

The obtained LED having the MQW structure in this embodiment was found to have a luminous intensity of 5 mW and a peak wavelength of 370 nm in the luminous spectrum at a driving current of 20 mA. The luminous efficiency was 7% which is 25 folds of the conventional LED.

EXAMPLE 10

This example comprises three different MQW emission layers 50 obtained by additionally doping Mg into each of the barriers 571, 581, and 591 in Examples 7 to 9 and processing them by heat treatment to obtain p-type conduction.

The obtained LEDs with each of the respective MQW emission layers 50 in this embodiment were found to have a luminous intensity of 10 mW and a peak wavelength of 380 nm in the luminous spectrum at a driving current of 20 mA. Their luminous efficiency was 15% which is 50 folds of the conventional LED.

EXAMPLE 11

Figure 18:
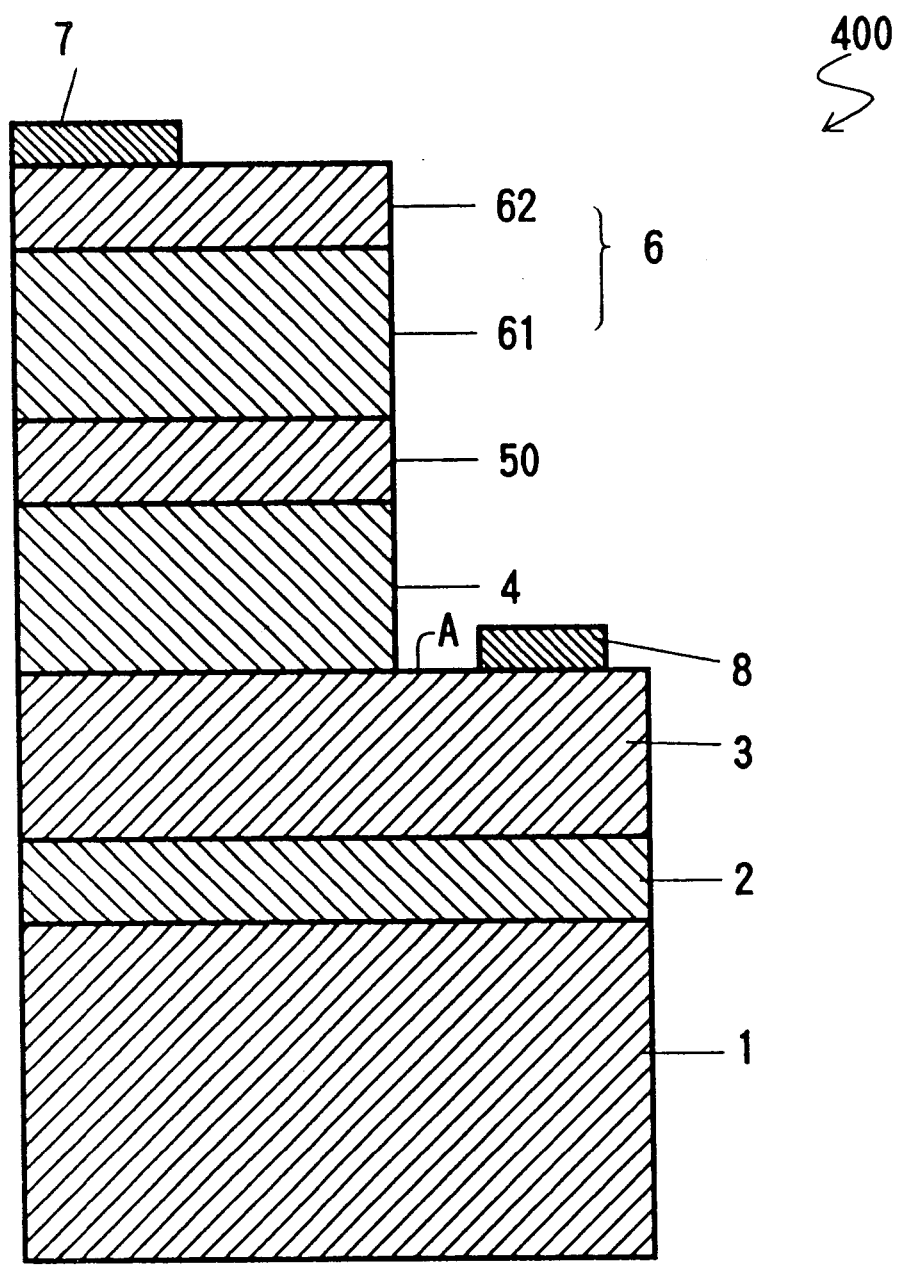
FIG. 18 is a diagram showing the structure of an LED in Example 11.

FIG. 18 shows a LED 400 embodied in Example 11. It has a sapphire ($Al_2O_3$) substrate 1 upon which 500 Å in thickness of aluminum nitride (AlN), buffer layer 2 was formed. Consecutively, two n-type layers are formed on the AlN buffer layer 2: about 5.0 μm in thickness of silicon (Si) doped GaN forming an $n^+$-layer 3 of high carrier concentration having an electron concentration of $5 \times 10^{18}/cm^3$, and about 0.5 μm in thickness of Si-doped GaN forming an n-layer 4 having an electron concentration of $5 \times 10^{17}/cm^3$. About a 0.41 μm in thickness of MQW, emission layer 50, is formed on the n-layer 4. About 0.5 μm in thickness of Mg-doped $Al_{0.08}Ga_{0.92}N$ is formed on the MQW emission layer 50, to form a p-layer 61 having a hole concentration of $5 \times 10^{17}/cm^3$ and a Mg concentration of $5 \times 10^{20}/cm^3$. About 1 μm in thickness of Mg-doped GaN, contact layer 62, is formed on the p-layer 61 and has a hole concentration of $7 \times 10^{18}/cm^3$ and an Mg concentration of $5 \times 10^{21}/cm^3$. Nickel electrodes 7 and 8 are formed on and connected to the contact layer 62 and an exposed area or portion of the $n^+$-layer 3, respectively.

Figure 19:
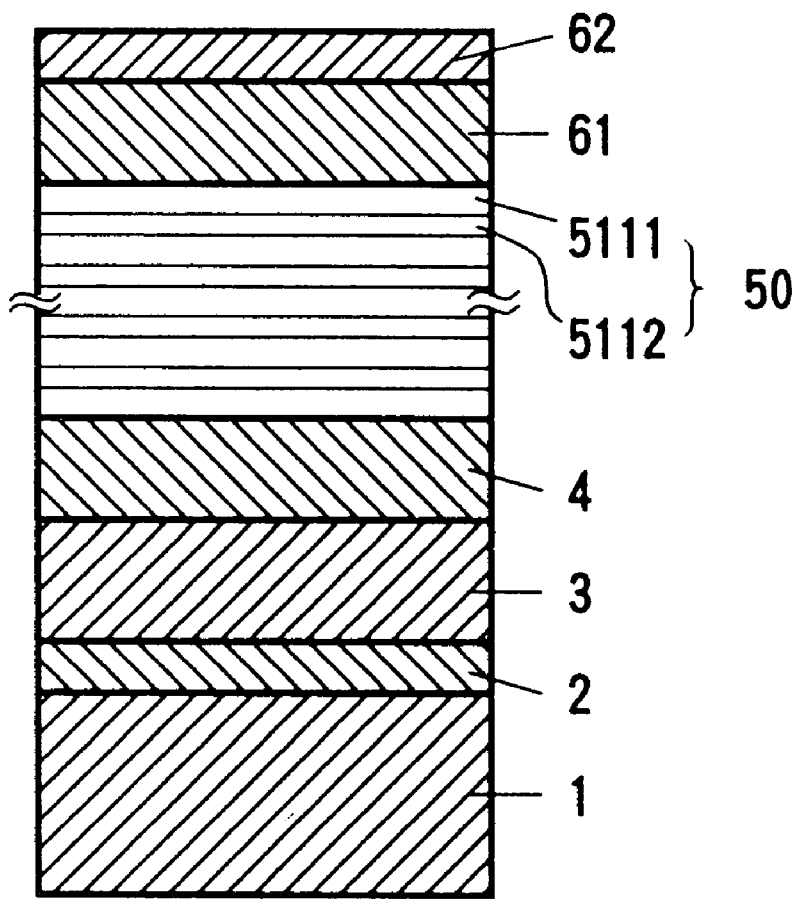
FIG. 19 is an explanatory view showing the structure of a multiple emission layer in Example 11.

As shown in FIG. 19, the MQW emission layer 50 is constituted by 21 barriers 5111 of GaN and 20 wells 5112 of Si-doped $In_{0.07}Ga_{0.93}N$. One of the 21 barriers 5111 is the lowermost layer which is formed on the n-type layer 4. The barriers 5111 and the wells 5112 are each about 100 Å in thickness and are laminated repeatedly and alternately to form a whole MQW layer 50 which is 0.41 μm thick. The concentration of Si doped into the wells 5112 is $5 \times 10^{18}/cm^3$.

The sapphire substrate 1 and the buffer layer 2 were prepared by the same processes described in Example 1. On the buffer layer 2, about 5.0 μm in thickness of Si-doped GaN, an $n^+$-layer 3 of high carrier concentration with an electron concentration of $5 \times 10^{18}/cm^3$ was formed on buffer layer 2 under conditions controlled by keeping the temperature of the sapphire substrate 1 at 1150° C. and by concurrently supplying for 70 min. $H_2$ at a flow rate of 20 liter/min., $NH_3$ at 10 liter/min., TMG at $1.7 \times 10^{-4}$ mol/min., and silane diluted to 0.86 ppm by $H_2$ at 200 ml/min.

About 0.5 μm in thickness of Si-doped GaN, an n-layer 4 with an electron concentration of $5 \times 10^{17}/cm^3$, was formed on the $n^+$-layer 3 under conditions controlled by keeping the temperature of the sapphire substrate 1 at 1100° C. and by concurrently supplying for 30 min. $N_2$ or $H_2$ at a flow rate of 10 liter/min., $NH_3$ at 10 liter/min., TMG at $1.12 \times 10^{-4}$ mol/min., and silane diluted to 0.86 ppm by $H_2$ at $10 \times 10^{-9}$ mol/min.

About 100 Å in thickness of undoped GaN, barrier 5111, was formed on the n-type layer 4 under conditions controlled by keeping the temperature of the sapphire substrate 1 at 850° C. and by concurrently supplying for 3 min. $H_2$ at a flow rate of 20 liter/min., $NH_3$ at 10 liter/min., and TMG at $1.7 \times 10^{-4}$ mol/min. Then, about 100 Å in thickness of Si-doped $In_{0.07}Ga_{0.93}N$, well 5112, having a Si concentration of $5 \times 10^{18}/cm^3$ was formed on the barrier 5111 under conditions controlled by concurrently supplying for 3 min. $N_2$ or $H_2$ at a flow rate of 20 liter/min., $NH_3$ at 10 liter/min., TMG at $2.1 \times 10^{-4}$ mol/min., TMI at $0.02 \times 10^{-4}$ mol/min., and silane diluted to 0.86 ppm by $H_2$ at $3 \times 10^{-9}$ mol/min. The barrier 5111 and the well 5112 were formed repeatedly and alternately to form a whole MQW emission layer 50 which was about 0.41 μm thick.

About 0.5 μm in thickness of Mg-doped $Al_{0.08}Ga_{0.92}N$, p-layer 61, was formed on the MQW emission layer 50 under conditions controlled by keeping the temperature of the sapphire substrate 1 at 1100° C. and by concurrently supplying, for 30 min., $N_2$ or $H_2$ at a flow rate of 20 liter/min., $NH_3$ at 10 liter/min., TMG at $1.12 \times 10^{-4}$ mol/min., TMA at $0.47 \times 10^{-4}$ mol/min., and $CP_2Mg$ at $2 \times 10^{-4}$ mol/min. The resistivity of the p-layer 61 was $10^8$ Ω·cm or more, exhibiting insulating characteristics. The impurity concentration of Mg doped into the p-layer 61 was $5 \times 10^{20}/cm^3$.

About 1.0 μm in thickness of Mg-doped GaN, contact layer 62, was formed on the p-layer 61 under conditions controlled by keeping the temperature of the sapphire substrate 1 at 1100° C. and concurrently supplying for 4 min. $N_2$ or $H_2$ at a flow rate of 20 liter/min., $NH_3$ at 10 liter/min., TMG at $1.12 \times 10^{-4}$ mol/min., and $CP_2Mg$ at $4 \times 10^{-3}$ mol/min. The resistivity of the p-layer 62 was $10^8$ Ω·cm or more, exhibiting insulating characteristics. The impurity concentration of Mg doped into the GaN layer 62 was $5 \times 10^{21}/cm^3$.

Then, heat treatment and other processes for forming electrodes were carried out by the same processes as those described in Example 7.

Since a donor or an acceptor impurity whose activation energy is small was doped into the wells 5112, the number of luminous center increased improving luminous efficiency.

The obtained LED 400 was found to have a luminous intensity of 2 mW and a peak wavelength of 380 nm in the luminous spectrum at a driving current of 20 mA. The luminous efficiency was improved to 3% which is 10 folds of the conventional LED.

In Example 11, the preferable Si concentration doped into the wells is in the range of from $1 \times 10^{17}/cm^3$ to $5 \times 10^{18}/cm^3$. When the concentration of Si is lower than $1 \times 10^{17}/cm^3$, luminous efficiency is decreased. When the concentration of Si is higher than $5 \times 10^{18}/cm^3$, crystallinity of the wells becomes poor.

Although $In_{0.07}Ga_{0.93}N$, or a ternary compound, was employed as the material of the wells 5112, a four-element compound such as $Al_{0.03}Ga_{0.89}In_{0.08}N$ can be used instead. Further, GaN was utilized as the barriers 5111 in Example 11. Alternately, semiconductors such as $Al_{x2}Ga_{y2}In_{1-x2-y2}N$ which have a wider band gap than that of the wells 5112 can be used. The number of set of the well and the barrier can be varied from 1 to 20. It is preferable to select composition ratios of the barriers 5111 and the wells 5112 roughly adjusting their lattice constants.

In Examples 7 to 11, the MQW emission layers 50 were sandwiched between two adjacent layers, the p-layer 61 and the n-layer 4, whose band gaps are wider than those of the barriers of the MQW emission layer 50 forming a double hetero-junction structure. Alternatively, a single hetero-junction structure can be used, and number of pair of the well and the barrier is one or more. The acceptor impurity and the donor impurity can be doped into both the well and the barrier.

Further, in Examples 7 to 11, heat annealing was used to obtain a p-type conduction. Alternatively, electron irradiation can be utilized to obtain the same.

In Examples 7 to 11, Zn was employed as an acceptor impurity and Si as a donor impurity. Alternatively, one or more of beryllium (Be), magnesium (Mg), cadmium (Cd), and mercury (Hg) of the group II elements can be used as an acceptor impurity and one or more of carbon (C), germanium (Ge), tin (Sn), lead (Pb) of the Group IV elements can be used as a donor impurity. Further, alternatively, one or more of the noted elements of the Group IV elements can be used as an acceptor impurity and one or more of sulfur (S), selenium (Se), and tellurium (Te) of the Group VI elements can be used as a donor impurity.

Although Examples 7 to 11 show embodiments of LEDs, they can also be applied to a laser diode.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A group III nitride compound semiconductor light-emitting device comprising:
   an emission layer doped with both an acceptor impurity and a donor impurity; said emission layer comprising a multi-layer structure having a layer doped with said acceptor impurity and a layer doped with said donor impurity, said layer doped with said acceptor impurity and said layer doped with said donor impurity being alternately formed on each other.

2. A group III nitride compound semiconductor light-emitting device of claim 1, wherein said emission layer is sandwiched between adjacent layers forming a double-hetero junction structure.

3. A group III nitride compound semiconductor light-emitting device of claim 2, wherein said emission layer comprises aluminum gallium indium nitride satisfying the formula $Al_xGa_yIn_{1-x-y}N$, inclusive of x=0, y=0, and x=y=0.

4. A group III nitride compound semiconductor light-emitting device of claim 1, wherein an undoped layer is formed between said layer doped with said acceptor impurity and said layer doped with said donor impurity.

5. A group III nitride compound semiconductor light-emitting device of claim 4, said undoped layer having a thickness of from 50 Å to 500 Å.

6. A group III nitride compound semiconductor light-emitting device of claim 1, wherein said acceptor impurity and said donor impurity are distributed into said emission layer by one of modulation doping and δ doping.

7. A group III nitride compound semiconductor light-emitting device of claim 1, wherein said layer doped with said acceptor impurity and said layer doped with said donor impurity are each from 50 Å to 500 Å in thickness.

8. A group III nitride compound semiconductor light-emitting device of claim 1, wherein said emission layer is doped with a concentration of magnesium (Mg) ranging from $1\times10^{19}/cm^3$ to $1\times10^{21}/cm^3$ and exhibits p-type conduction.

9. A group III nitride compound semiconductor light-emitting device of claim 1, wherein said acceptor impurity is selected from the group comprising cadmium (Cd), zinc (Zn), beryllium (Be), and calcium (Ca).

10. A group III nitride compound semiconductor light-emitting device of claim 1, wherein said donor impurity is selected from the group comprising silicon (Si), germanium (Ge), tellurium (Te), and sulfur (S).

11. A group III nitride compound semiconductor light-emitting device of claim 1, wherein said layer doped with said acceptor layer comprises aluminum gallium indium nitride satisfying the formula $Al_xGa_yIn_{1-x-y}N$, inclusive of x=0, y=0, and x=y=0, and wherein said layer doped with said donor impurity comprises aluminum gallium indium nitride with a varied composition ratio of said formula.

12. A group III nitride compound semiconductor light-emitting device comprising:
    an emission layer doped with both an acceptor impurity and a donor impurity, said emission layer having a quantum well (QW) structure having at least one well layer.

13. A group III nitride compound semiconductor light-emitting device of claim 12, wherein said well layer is doped with both an acceptor impurity and a donor impurity.

14. A group III nitride compound semiconductor light-emitting device of claim 12, wherein said well layer and a barrier layer of said emission layer are doped with both an acceptor impurity and a donor impurity.

15. A group III nitride compound semiconductor light-emitting device of claim 12, wherein said emission layer is an active layer comprising a zinc (Zn) and silicon (Si) doped indium aluminum gallium nitride (InAlGaN) compound.

16. A group III nitride compound semiconductor light-emitting device of claim 13, wherein said quantum well (QW) structure comprises a barrier layer comprising an indium aluminum gallium nitride (InAlGaN) compound, having composition ratios different from said well layer.

17. A group III nitride compound semiconductor light-emitting device of claim 16, wherein said composition ratios are designed to match a lattice constant of said barrier layer with a lattice constant of said well layer.

18. A group III nitride compound semiconductor light-emitting device of claim 12, wherein said quantum well (QW) structure comprises said well layer sandwiched between barrier layers, said barrier layer being doped with an acceptor impurity.

19. A group III nitride compound semiconductor light-emitting device of claim 12, wherein said well layer is from 50 Å to 200 Å in thickness.

20. A group III nitride compound semiconductor light-emitting device of claim 16, wherein said barrier layer is from 50 Å to 200 Å in thickness.

21. A group III nitride compound semiconductor light-emitting device of claim 12, wherein said emission layer having a quantum well (QW) structure comprises alternating $Al_{x2}Ga_{1-x2}N$ barrier layers and $Al_{x1}Ga_{1-x1}N$ well layers, where $0 \leq x1 \leq 1$, $0 \leq x2 \leq 1$, and x1<x2.

22. A group III nitride compound semiconductor light-emitting device of claim 21, wherein said well layer is doped with both an acceptor impurity and a donor impurity.

23. A group III nitride compound semiconductor light-emitting device of claim 21, wherein said well layer and said barrier layer are doped with both an acceptor impurity and a donor impurity.

24. A group III nitride compound semiconductor light-emitting device of claim 21, wherein said quantum well (QW) structure comprises a multi quantum well (MQW) having a plurality of well layers, a first selected one of said well layers being doped with said acceptor impurity and a second selected one of said well layers being doped with said donor impurity, the first and second selected well layers being adjacent to each other.

25. A group III nitride compound semiconductor light-emitting device of claim 21, wherein said well layer is doped with said acceptor impurity and said barrier layer is doped with said donor impurity.

26. A group III nitride compound semiconductor light-emitting device of claim 25, wherein said well layer is doped with said donor impurity and said barrier layer is doped with said acceptor impurity.

27. A group III nitride compound semiconductor light-emitting device of claim 25, wherein said acceptor impurity is zinc (Zn) and said donor impurity is silicon (Si).

28. A group III nitride compound semiconductor light-emitting device of claim 21, wherein said emission layer is sandwiched between a p-layer comprising acceptor doped $Al_{x3}Ga_{1-x3}N$ with p-type condition where $x1 \leq x3$ and an n-layer of a donor doped $Al_{x4}Ga_{1-x4}N$ with n-type condition where $x1 \leq x4$.

29. A group III nitride compound semiconductor light-emitting device of claim 28, wherein said acceptor impurity doped into said p-layer is magnesium (Mg) and said donor impurity doped into said n-layer is silicon (Si).

30. A group III nitride compound semiconductor light-emitting device of claim 12, wherein said quantum well (QW) structure comprises an $Al_{x1}Ga_{y1}In_{1-x1-y1}N$ well and an $Al_{x2}Ga_{y2}In_{1-x2-y2}N$ barrier, a band gap of said barrier being wider than a band gap of said well, said well being doped with one of a donor impurity and an acceptor impurity.

31. A group III nitride compound semiconductor light-emitting device of claim 12, wherein said quantum well (QW) structure comprises an $Al_{x1}Ga_{y1}In_{1-x1-y1}N$ well and an $Al_{x2}Ga_{y2}In_{1-x2-y2}N$ barrier, a band gap of said barrier being wider than a band gap of said well, and said barrier being doped with one of a donor impurity and an acceptor impurity.

32. A group III nitride compound semiconductor light-emitting device of claim 30, wherein said barrier comprises gallium nitride (GaN).

33. A group III nitride compound semiconductor light-emitting device of claim 30, wherein said donor impurity is one of silicon (Si), tellurium (Te), sulfur (S), and selenium (Se) and said acceptor impurity is one of magnesium (Mg) and zinc (Zn).

34. A group III nitride compound semiconductor light-emitting device of claim 30, wherein said well is doped with an impurity concentration ranging from $1 \times 10^{17}/cm^3$ to $5 \times 10^{18}/cm^3$.

35. A group III nitride compound semiconductor light-emitting device of claim 30, wherein a lattice constant of said well matches a lattice constant of said barrier.

36. A group III nitride compound semiconductor light-emitting device of claim 12, wherein said well layer and said barrier layer are doped with both an acceptor impurity and a donor impurity.

37. A group III nitride compound semiconductor light-emitting device of claim 12, wherein said quantum well (QW) structure comprises a multi quantum well (MQW) having a plurality of well layers, a first selected one of said well layers being doped with said acceptor impurity and a second selected one of said well layers being doped with said donor impurity, the first and second selected well layers being adjacent to each other.

38. A group III nitride compound semiconductor light-emitting device of claim 12, wherein said well layer is doped with said acceptor impurity and said barrier layer is doped with said donor impurity.

39. A group III nitride compound semiconductor light-emitting device of claim 12, wherein said well layer is doped with said donor impurity and said barrier layer is doped with said acceptor impurity.

* * * * *

UNITED STATES PATENT AND TRADEMARK OFFICE
CERTIFICATE OF CORRECTION

PATENT NO. : 5,945,689
DATED : August 31, 1999
INVENTOR(S) : Koike et al.

It is certified that error appears in the above-identified patent and that said Letters Patent is hereby corrected as shown below:

Claim 28,
Lines 9 and 10, please delete the word "condition", and replace with -- conduction --.

Signed and Sealed this

Twenty-sixth Day of February, 2002

Attest:

JAMES E. ROGAN
Attesting Officer    Director of the United States Patent and Trademark Office